(12) United States Patent
Ohnuma

(10) Patent No.: US 7,776,722 B2
(45) Date of Patent: Aug. 17, 2010

(54) MANUFACTURING METHODS OF SEMICONDUCTOR SUBSTRATE, THIN FILM TRANSISTOR AND SEMICONDUCTOR DEVICE

(75) Inventor: Hideto Ohnuma, Atsugi (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 213 days.

(21) Appl. No.: 12/076,992

(22) Filed: Mar. 26, 2008

(65) Prior Publication Data
US 2008/0286953 A1 Nov. 20, 2008

(30) Foreign Application Priority Data
May 18, 2007 (JP) .............................. 2007-132590

(51) Int. Cl.
*H01L 21/322* (2006.01)
(52) U.S. Cl. ................ 438/475; 438/311; 257/E21.218
(58) Field of Classification Search ................ 438/475, 438/311; 257/E21.218
See application file for complete search history.

(56) References Cited

U.S. PATENT DOCUMENTS

| | | |
|---|---|---|
| 5,374,564 A | 12/1994 | Bruel |
| 6,127,702 A | 10/2000 | Yamazaki et al. |
| 6,191,008 B1 | 2/2001 | So |
| 6,271,101 B1 | 8/2001 | Fukunaga |
| 6,281,032 B1 | 8/2001 | Matsuda et al. |
| 6,335,231 B1 | 1/2002 | Yamazaki et al. |
| 6,372,609 B1 * | 4/2002 | Aga et al. ................... 438/459 |
| 6,380,046 B1 | 4/2002 | Yamazaki |
| 6,388,652 B1 | 5/2002 | Yamazaki et al. |
| 6,602,761 B2 | 8/2003 | Fukunaga |
| 6,686,623 B2 | 2/2004 | Yamazaki |
| 6,767,802 B1 | 7/2004 | Maa et al. |
| 6,778,164 B2 | 8/2004 | Yamazaki et al. |
| 6,803,264 B2 | 10/2004 | Yamazaki et al. |
| 6,875,633 B2 | 4/2005 | Fukunaga |
| 6,908,797 B2 | 6/2005 | Takano |

(Continued)

FOREIGN PATENT DOCUMENTS
JP 11-163363 A 6/1999

(Continued)

OTHER PUBLICATIONS
'Search Report (Application No. 08005222.8) Dated May 18, 2010,.

*Primary Examiner*—Thao X Le
*Assistant Examiner*—Ajay K Arora
(74) *Attorney, Agent, or Firm*—Eric J. Robinson; Robinson Intellectual Property Law Office, P.C.

(57) ABSTRACT

In manufacturing an SOI substrate, in a case where a step is present in a surface to be bonded, a substrate may warp and the contact area becomes small due to the step, an SOI layer having a desired shape cannot be obtained in some cases. However, the present invention provides an SOI substrate having a desired shape even when a step is produced on a surface to be bonded. Between steps on the surface to be bonded, dummy patterns 302 are formed at predetermined intervals, and thus the warp of the substrate to be bonded can be suppressed, the adhesion between the bonded substrates can be ensured, and an SOI layer having a desired shape can be obtained.

35 Claims, 14 Drawing Sheets

U.S. PATENT DOCUMENTS

| | | | |
|---|---|---|---|
| 7,176,525 B2 | 2/2007 | Fukunaga | |
| 7,199,024 B2 | 4/2007 | Yamazaki | |
| 7,253,082 B2 * | 8/2007 | Adachi et al. | 438/459 |
| 7,256,776 B2 | 8/2007 | Yamazaki et al. | |
| 7,291,542 B2 | 11/2007 | Iwamatsu et al. | |
| 7,560,313 B2 * | 7/2009 | Aga et al. | 438/149 |
| 2002/0109144 A1 | 8/2002 | Yamazaki | |
| 2003/0183876 A1 | 10/2003 | Takafuji et al. | |
| 2004/0056332 A1 | 3/2004 | Bachrach et al. | |
| 2004/0061176 A1 | 4/2004 | Takafuji et al. | |
| 2004/0061200 A1 | 4/2004 | Iwamatsu et al. | |
| 2004/0104424 A1 | 6/2004 | Yamazaki | |
| 2004/0209442 A1 | 10/2004 | Takakuwa et al. | |
| 2005/0009252 A1 | 1/2005 | Yamazaki et al. | |
| 2005/0260800 A1 | 11/2005 | Takano | |
| 2007/0087488 A1 | 4/2007 | Moriwaka | |
| 2007/0108510 A1 | 5/2007 | Fukunaga | |
| 2007/0173000 A1 | 7/2007 | Yamazaki | |
| 2007/0184632 A1 | 8/2007 | Yamazaki et al. | |
| 2007/0281446 A1 | 12/2007 | Winstead et al. | |
| 2007/0291022 A1 | 12/2007 | Yamazaki et al. | |
| 2008/0224274 A1 | 9/2008 | Yamazaki et al. | |
| 2008/0258254 A1 | 10/2008 | Boeuf | |
| 2008/0261379 A1 * | 10/2008 | Jinbo et al. | 438/458 |

FOREIGN PATENT DOCUMENTS

| | | |
|---|---|---|
| JP | 2000-012864 A | 1/2000 |
| JP | 2004-119943 A | 4/2004 |
| JP | 2004-134675 A | 4/2004 |
| JP | 2006-229047 A | 8/2006 |

* cited by examiner

MANUFACTURING METHODS OF SEMICONDUCTOR SUBSTRATE, THIN FILM TRANSISTOR AND SEMICONDUCTOR DEVICE

BACKGROUND OF THE INVENTION

1. Field of the Invention

The present invention relates to a manufacturing method of a semiconductor substrate. In particular, the present invention relates to a manufacturing method of a semiconductor substrate obtained by bonding a single crystalline semiconductor layer or a polycrystalline semiconductor layer to a substrate having an insulating surface, such as glass.

2. Description of the Related Art

Integrated circuits have been developed, which use a semiconductor substrate called a silicon-on-insulator (SOI) substrate that has a thin single crystal semiconductor layer over an insulating surface, instead of a silicon wafer that is manufactured by thinly slicing an ingot of single crystal semiconductor. An integrated circuit using an SOI substrate has been attracting attention because parasitic capacitance between drains of the transistors and the substrate is reduced and a semiconductor integrated circuit is made to have higher performance.

As a method for manufacturing SOI substrates, a hydrogen ion implantation separation method is known (for example, see Reference 1: U.S. Pat. No. 6,372,609). The hydrogen ion implantation separation method is a method in which hydrogen ions are implanted into a silicon wafer to form a microbubble layer in the silicon wafer at a predetermined depth from a surface thereof, the microbubble layer is used as a cleavage plane, and a thin silicon layer (SOI layer) is bonded to another silicon wafer. In addition to thermal treatment for separation of an SOI layer, it is necessary to perform thermal treatment in an oxidizing atmosphere to form an oxide film on the SOI layer, remove the oxide film, and perform thermal treatment at 1000 to 1300° C. in a reducing atmosphere to increase the bond strength.

As one of the known examples of SOI substrates in which SOI layers are formed over glass substrates, a structure is known in which a thin film of single crystal silicon having a covering film is formed over a glass substrate having a coating film by a hydrogen ion implantation separation method (see Reference 2: Japanese Published Patent Application No. 2004-134675). Also in this case, hydrogen ions are implanted into a piece of single crystal silicon to form a hydrogen implanted layer in the piece of single crystal silicon at a predetermined depth from a surface thereof, a glass substrate is bonded to the piece of single crystal silicon, then, the piece of silicon is separated using the hydrogen implanted layer, and a thin silicon layer (SOI layer) is formed over the glass substrate.

These techniques are suitable for the case when flat surfaces are bonded to each other; however, if steps due to plural islands formed on the surface of a single crystal silicon are present, a substrate opposite to the single crystal silicon may warp in bonding and thus the contact area becomes small, and as a result, an SOI layer having a desired shape cannot be obtained in some cases. For example, when a glass substrate having a thickness of 700 μm is used as the opposite substrate and the interval between plural islands is 200 μm or more, the substrate may warp.

SUMMARY OF THE INVENTION

It is an object of the present invention to provide an SOI substrate having a desired shape even when a step is produced on a surface to be bonded.

In order to achieve the above object, according an aspect of the present invention, a dummy pattern is formed at a given interval between steps formed on a surface to be bonded.

A dummy pattern is formed at a given interval between steps on the surface to be bonded, so that the warp of the bonded substrate can be suppressed and the adhesion between the substrates is secured, thereby obtaining an SOI layer having a desired shape.

DETAILED DESCRIPTION OF THE INVENTION

Embodiment Mode

Figure 1A:
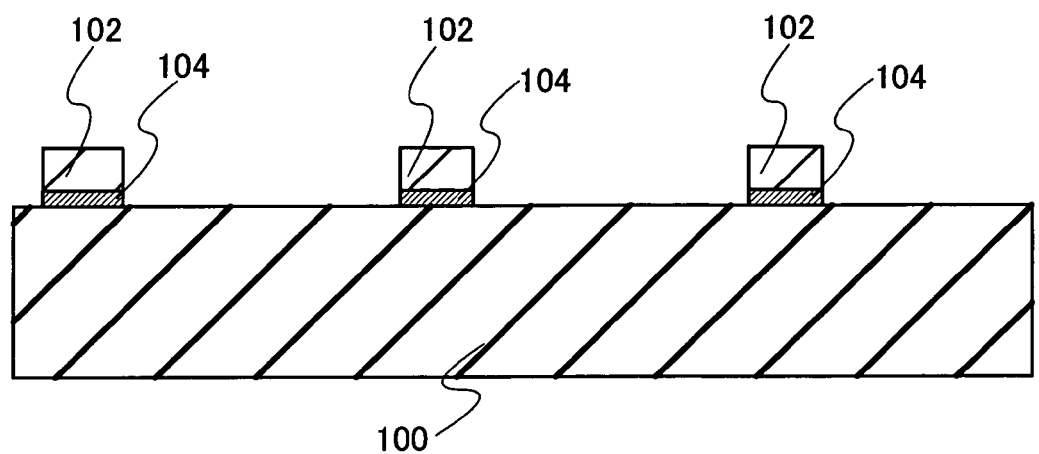
FIGS. 1A and 1B are each a cross-sectional view of a structure of a semiconductor device in Embodiment Mode 1 of the present invention.

Embodiment modes of the present invention will be described with reference to the drawings. It is easily understood by those skilled in the art that various changes may be made in modes and details without departing from the spirit and the scope of the invention. Therefore, the present invention should not be interpreted as being limited to the description of the embodiment modes below. Note that description of each embodiment mode can be freely applied to, combined with or replaced by any of the other embodiment modes. In structures of the present invention described below, the same reference numerals are commonly given to the same components or components having similar functions throughout the drawings.

Embodiment Mode 1

Figure 1B:
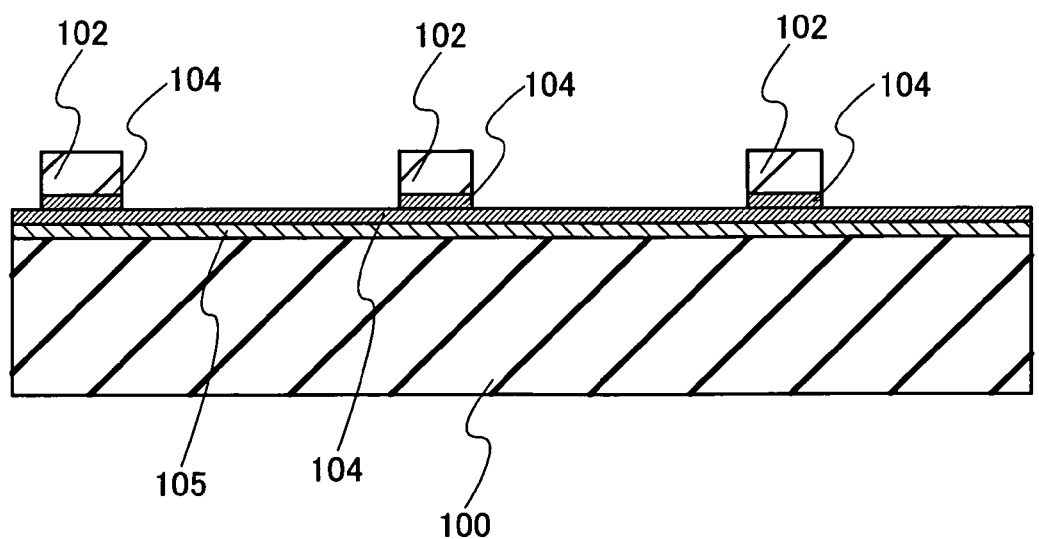

FIGS. 1A and 1B each illustrate a mode of a semiconductor device according to Embodiment Mode 1 of the present invention. In FIG. 1A, a base substrate 100 is a substrate having an insulating surface or an insulating substrate, and any of a variety of glass substrates that are used in the electronics industry, such as aluminosilicate glass, aluminoborosilicate glass, and barium borosilicate glass, can be used. Alternatively, a quartz glass substrate or a semiconductor substrate such as a silicon wafer can be used.

LTSS layers 102 are formed from a single crystal semiconductor, and have a desired pattern depending on an intended use. In this embodiment mode, island-shaped patterns are arranged at given intervals. Note that the term "LTSS" is an abbreviation of Low Temperature Single crystal Semiconductor, and means a single crystal semiconductor which does not need a high temperature process after it is bonded to a substrate having an insulating surface or an insulating substrate at low temperature. As a material of the LTSS layer 102, single crystal silicon is typically used. Alternatively, a crystalline semiconductor layer formed from silicon, germanium, or a compound semiconductor such as gallium arsenide or indium phosphide, which can be separated from a single crystal semiconductor substrate or a polycrystalline semiconductor substrate by a hydrogen ion implantation separation method or the like can be used, for example.

Between the base substrate 100 and the LTSS layer 102 which are described above, a bonding layer 104 whose surface is smooth and hydrophilic is provided. A silicon oxide film is suitable for the bonding layer 104. In particular, a silicon oxide film formed by a chemical vapor deposition method using a silane-based gas such as a silane gas, a disilane gas, a trisilane gas or an organic silane gas, is preferable. In the case of using such a silane-based gas, a mixture gas with $NO_2$ or a mixture gas with $N_2O$ is preferable. Examples of such an organic silane gas include silicon-containing compounds such as tetraethoxysilane (TEOS) (chemical formula: $Si(OC_2H_5)_4$), trimethylsilane (TMS) (chemical formula: $(CH_3)_3SiH$), tetramethylcyclotetrasiloxane (TMCTS), octamethylcyclotetrasiloxane (OMCTS), hexamethyldisilazane (HMDS), triethoxysilane (chemical formula: $SiH(OC_2H_5)_3$), and trisdimethylaminosilane (chemical formula: $SiH(N(CH_3)_2)_3$). As a chemical vapor deposition method, any method of plasma CVD, thermal CVD and photo CVD may be used. Further, the silicon oxide film may be a thermal oxidation film, and in particular, a thermal oxidation film including chlorine or fluorine is preferable.

The bonding layer 104 whose surface is smooth and hydrophilic is formed to a thickness of 5 nm to 500 nm, on the LTSS layer 102 side. With such a thickness, it is possible to smooth roughness of a surface on which a film is to be formed and also to ensure smoothness of a growing surface of the film. In addition, distortion of a substrate to be bonded with the bonding layer 104 can be relieved. The base substrate 100 may also similarly be provided with a silicon oxide film. In other words, in bonding the LTSS layers 102 to the base substrate 100 that is a substrate having an insulating surface or an insulating substrate, a strong bond can be formed when the bonding layer 104 formed of a silicon oxide film preferably using organic silane as a material is provided over one or both of surfaces that are to form a bond.

The bonding layer 104 is provided on the LTSS layers 102 side and is disposed in close contact with a surface of the base substrate 100, whereby bonding can be performed even at room temperature. In order to form a stronger bond, the base substrate 100 and the LTSS layers 102 may be pressed. Further, thermal treatment is preferably performed. The thermal treatment may be performed under pressure.

The bonding layer 104 may be an oxide film formed by using a chemical including ozone water and hydrogen peroxide or an oxide film formed by using ozone water. In that case, the thickness may be from 0.5 nm to 5 nm. Further, the bonding layer may be a surface layer of a semiconductor layer which is terminated with hydrogen or fluorine.

To bond the base substrate 100 and the bonding layer 104, which are formed from different kinds of materials, surfaces thereof are cleaned. When the base substrate 100 and the bonding layer 104 are disposed in close contact with each other in such a condition, a bond is formed by attraction between the surfaces. It is preferable to perform treatment in which a plurality of hydroxy groups is attached to at least one of surfaces of the base substrate 100 and the bonding layer 104. For example, it is preferable to perform oxygen plasma treatment or ozone treatment on a surface of the base substrate 100 so that the surface is made hydrophilic. In the case of performing treatment in which at least one surface of the base substrate 100 and the bonding layer 104 is made hydrophilic, a bond is formed by hydrogen bond by the action of a hydroxy group on the surface. To increase strength of a bond formed at room temperature, it is preferable to perform thermal treatment.

As treatment for bonding the base substrate 100 and the bonding layer 104, which are formed from different kinds of materials, to each other at low temperature, a surface that is to form a bond may be cleaned by being irradiated with an ion beam using an inert gas such as argon. By the ion beam irradiation, a dangling bond is exposed on at least one of surfaces of the base substrate 100 and the bonding layer 104 and an extremely active surface is formed. When surfaces of the base substrate 100 and the bonding layer 104, at least one of which is an active surface, are disposed in close contact with each other, a bond can be formed even at low temperature. A method for forming a bond by activation of a surface is preferably carried out in vacuum because the surfaces are needed to be highly cleaned.

The LTSS layer 102 is formed by separating a thin slice from a single crystal semiconductor substrate. For example, the single crystal semiconductor substrate is irradiated with ions of hydrogen, an inert gas typified by helium, or halogen typified by fluorine to form an embrittlement layer in the single crystal semiconductor substrate at a predetermined depth from the surface, then thermal treatment is performed and thus a single crystal silicon layer which is a surface layer is separated, thereby forming the LTSS layer 102. Alternatively, a method may be used in which after single crystal silicon is epitaxially grown over porous silicon, cleavage by water-jetting is performed so that a porous silicon layer is separated. A thickness of the LTSS layer 102 is set to be 5 nm to 500 nm, preferably 10 nm to 200 nm. Note that in the present invention, a region which is weakened such that minute voids are formed therein, by irradiation of a single crystal semiconductor substrate with ions and impact of the ions or an atom or an molecule generated from the ions to the semiconductor, is referred to as an embrittlement layer.

The example of forming the bonding layer 104 is described above. However, if the bond strength between the base substrate 100 and the LTSS layer 102 is sufficient, the bonding layer 104 is not necessarily formed, and the base substrate 100 and the LTSS layer 102 may be directly bonded.

FIG. 1B shows a structure in which the base substrate 100 is provided with a barrier layer 105 and the bonding layer 104. By providing the barrier layer 105, when the LTSS layers 102 are bonded to the base substrate 100, the LTSS layers 102 can be prevented from being contaminated by impurities such as mobile ions like alkali metal or alkaline earth metal that are diffused from a glass substrate that is used as the base substrate 100. The bonding layers 104 on the base substrate 100 side may be provided as appropriate.

In the above FIGS. 1A and 1B, a nitrogen-containing insulating layer may be provided between the LTSS layer 102 and the bonding layer 104. The nitrogen-containing insulating layer is formed using a single layer or a stacked layer of a plurality of films selected from a silicon nitride film, a silicon nitride oxide film, and/or a silicon oxynitride film. For example, the nitrogen-containing insulating layer can be formed by stacking a silicon oxynitride film and a silicon nitride oxide film in this order from the LTSS layer 102 side. The bonding layers 104 are provided in order to form a bond with the base substrate 100 whereas the nitrogen-containing insulating layer is preferably provided in order to prevent impurities such as mobile ions or moisture from diffusing into and contaminating the LTSS layers 102.

Note that a silicon oxynitride film means a film that contains more oxygen than nitrogen and, in the case where measurements are performed using Rutherford backscattering spectrometry (RBS) and hydrogen forward scattering (HFS), includes oxygen, nitrogen, silicon, and hydrogen at concentrations ranging from 50 at. % to 70 at. %, 0.5 at. % to 15 at. %, 25 at. % to 35 at. %, and 0.1 at. % to 10 at. %, respectively. Further, a silicon nitride oxide film means a film that contains more nitrogen than oxygen and, in the case where measurements are performed using RBS and HFS, includes oxygen, nitrogen, silicon, and hydrogen at concentrations ranging from 5 at. % to 30 at. %, 20 at. % to 55 at. %, 25 at. % to 35 at. %, and 10 at. % to 30 at. %, respectively. Note that percentages of nitrogen, oxygen, silicon, and hydrogen fall within the ranges given above, where the total number of atoms contained in the silicon oxynitride film or the silicon nitride oxide film is defined as 100 at. %.

A manufacturing method of a semiconductor substrate in Embodiment Mode 1 of the present invention will now be described with reference to drawings.

Figure 2A:
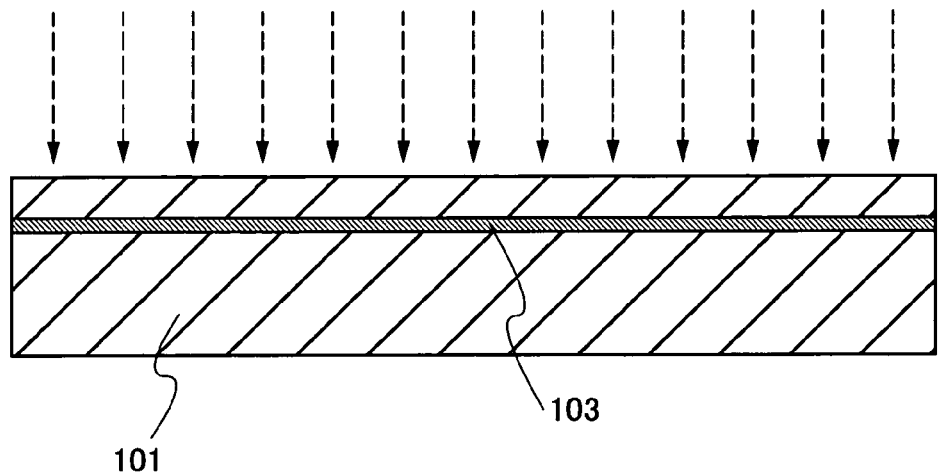
FIGS. 2A to 2C are cross-sectional views illustrating a manufacturing method of a semiconductor substrate in Embodiment Mode 1 of the present invention.

A semiconductor substrate 101 shown in FIG. 2A is cleaned, and the semiconductor substrate 101 is irradiated with ions accelerated by an electric field from a surface thereof to form an embrittlement layer 103 at a predetermined depth in the semiconductor substrate 101. The ion irradiation is conducted in consideration of the thickness of the LTSS layers to be transferred to a base substrate. The thickness of the LTSS layers is set to be 5 nm to 500 nm, preferably 10 nm to 200 nm. The accelerating voltage in irradiating the semiconductor substrate 101 with ions is set in consideration of such a thickness. The embrittlement layer is formed by irradiation with ions of hydrogen, an inert gas typified by helium, or halogen typified by fluorine.

Because there is need for irradiation with ions at a high dose in forming the embrittlement layer, there are cases where the surface of the semiconductor substrate 101 is roughened. Therefore, a protective film against ion irradiation, such as a silicon oxide, a silicon nitride film or a silicon nitride oxide film, may be provided to a thickness of 0.5 nm to 200 nm over a surface to be irradiated with ions.

Figure 2B:
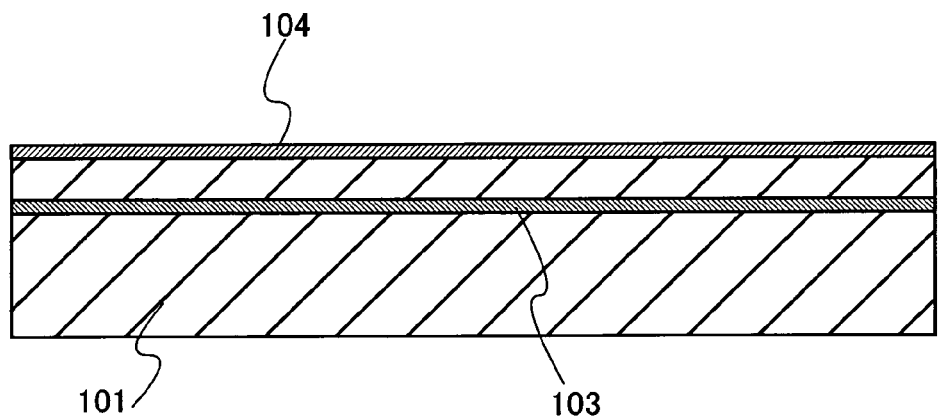

Next, as illustrated in FIG. 2B, a silicon oxide film is formed as the bonding layer 104 over a surface that is to form a bond with the base substrate. The silicon oxide film is preferably formed by a chemical vapor deposition method using an organic silane gas as described above. Alternatively, a silicon oxide film formed by a chemical vapor deposition method using a silane-based gas such as a silane gas, a disilane gas, or a trisilane gas can be used. Film formation by a chemical vapor deposition method is performed at a formation temperature of, for example, 350° C. or lower, as a temperature at which degasification does not occur in the embrittlement layer 103 that is formed in the single crystal semiconductor substrate. Further, thermal treatment for separation of the LTSS layer from a single crystal semiconductor substrate or a polycrystalline semiconductor substrate is performed at higher temperature than the temperature at which the silicon oxide film is formed.

As a chemical vapor deposition method, any method of plasma CVD, thermal CVD and photo CVD may be used. In particular, by plasma CVD using TEOS and $O_2$, or thermal CVD using $SiH_4$ and $NO_2$, a flat silicon oxide film which is suitable for the bonding layer can be formed at a low temperature of 350° C. or lower, which is preferable. Alternatively, the silicon oxide film may be a thermal oxide film, and in particular, a thermal oxide film including chlorine or fluorine is preferable.

Figure 2C:
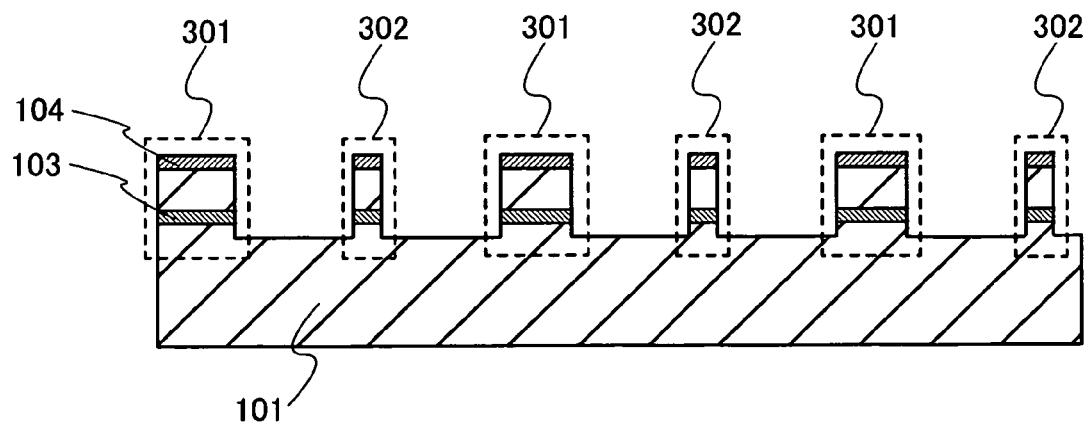

Next, as illustrated in FIG. 2C, the semiconductor substrate 101 having the embrittlement layer 103 and the bonding layer 104 is patterned into a desired shape. At that time, element formation patterns 301 which is used to form an element in a later step and dummy patterns 302 which are not used to form the element are formed at predetermined intervals. The patterning can be conducted by etching the bonding layer 104, the semiconductor substrate 101, and the embrittlement layer 103 in regions which are not to serve as the element formation patterns 301 and the dummy patterns 302 by a general photolithography technique and a general etching technique. For the depth in etching, the depth to the embrittlement layer 103 is sufficient, but it is preferable that the semiconductor substrate 101 under the embrittlement layer 103 is slightly etched to completely remove the embrittlement layer which should be removed.

Figure 3A:
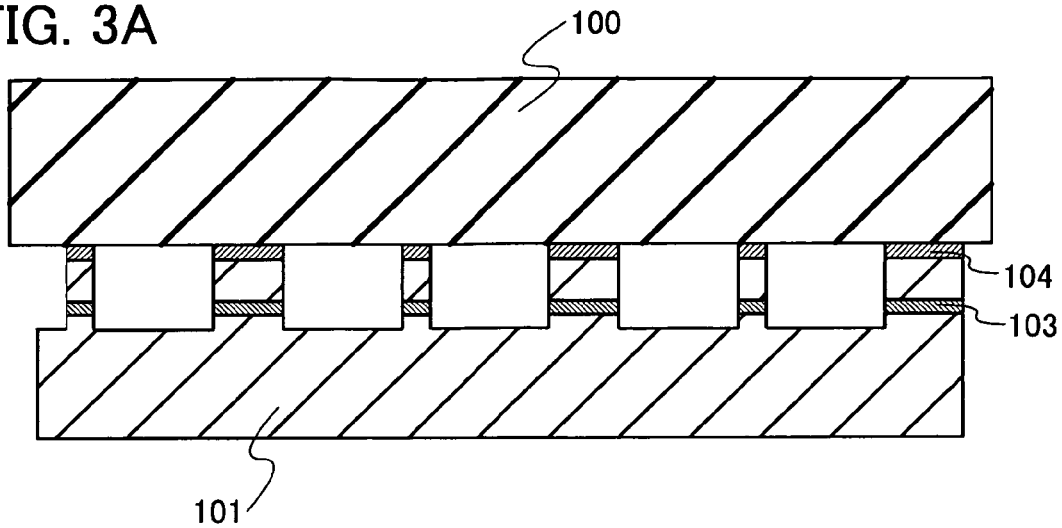
FIGS. 3A to 3C are cross-sectional views illustrating a manufacturing method of a semiconductor substrate in Embodiment Mode 1 of the present invention.

FIG. 3A illustrates a mode in which the base substrate 100 is disposed in close contact with the bonding layers 104 formed on the semiconductor substrate 101 such that the base substrate 100 and the bonding layers 104 are bonded to each other. Surfaces that are to form a bond are cleaned sufficiently. By disposing the base substrate 100 in close contact with the bonding layer 104, a bond is formed therebetween. This bond is made by Van der Waals forces. By pressing the base substrate 100 and the semiconductor substrate 101, a stronger bond can be formed by hydrogen bond.

In bonding, if the dummy patterns 302 do not exist and the interval between the plural element formation patterns 301 is wide, the base substrate 100 may warp, and the contact area becomes small, so that the strong bonding by Van der Waals forces or hydrogen bond cannot be obtained easily. By providing the dummy patterns 302 between the plural element formation patterns 301, the warp of the base substrate 100 is suppressed, the adhesion between the base substrate 100 and the semiconductor substrate 101 can be secured and a strong bond can be realized. For example, when the base substrate 100 is a glass substrate having a thickness of 700 μm, if the interval between plural islands is 200 μm or wider, the substrate may warp. Thus, in this case, the dummy patterns 302 should be arranged appropriately such that the intervals between the dummy patterns 302 be larger than 200 μm.

The dummy patterns 302 are arranged at such an interval that can suppress the warp of the base substrate 100 and secure the adhesion between the base substrate 100 and the semiconductor substrate 101, depending on the material or the thickness of the base substrate 100.

In order to form a favorable bond, the surface may be activated. For example, the surface that is to form a bond is irradiated with an atomic beam or an ion beam. When an atomic beam or an ion beam is used, an inert gas neutral atom beam or inert gas ion beam of argon or the like can be used. Alternatively, plasma irradiation or radical treatment is performed. RIE (Reactive Ion Etching) mode plasma treatment using at least one of oxygen, nitrogen and argon, or a mixture gas including at least one of oxygen, nitrogen and argon may be conducted. Such a surface treatment makes it easier to form a bond between different kinds of materials even at a temperature of from 200° C. to 400° C.

After the base substrate 100 and the semiconductor substrate 101 are bonded to each other with the bonding layer 104 interposed therebetween, it is preferable that thermal treatment or pressure treatment be performed. Thermal treatment or pressure treatment makes it possible to increase Van der Waals forces, increase the density of hydrogen bond, or change Van der Waals forces into a covalent bond, so that the bond strength can be increased. The thermal treatment is preferably performed at a temperature lower than the upper temperature limit of the base substrate 100. The pressure treatment is performed so that pressure is applied in a direction perpendicular to the bonding surface, in consideration of the pressure resistance of the base substrate 100 and the semiconductor substrate 101.

Figure 3B:
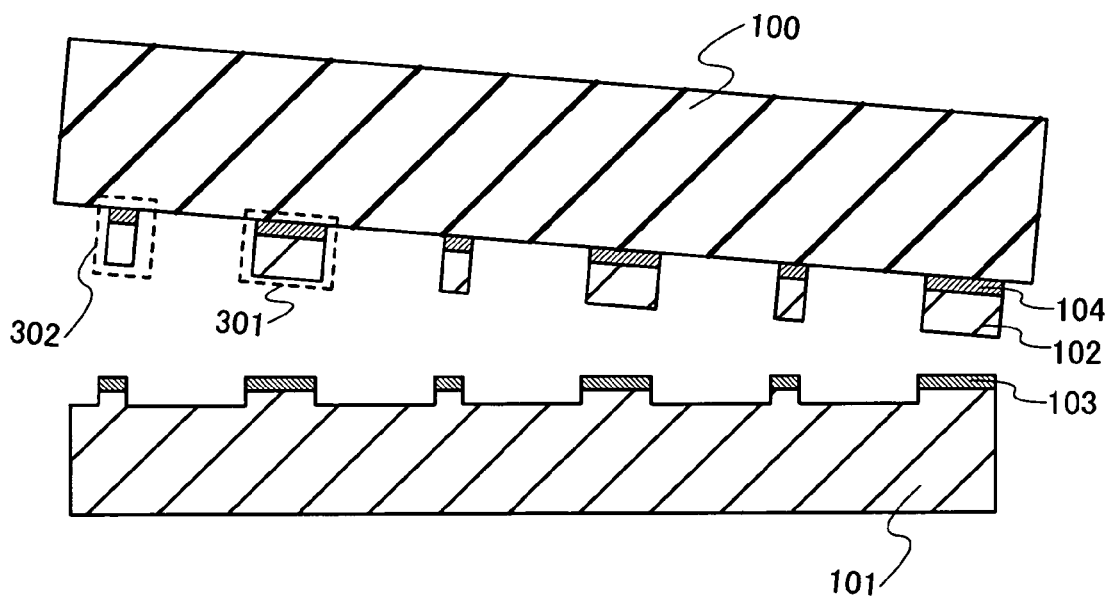

In FIG. 3B, after the base substrate 100 and the semiconductor substrate 101 are bonded together, thermal treatment is performed to separate the semiconductor substrate 101 from the base substrate 100 with the embrittlement layer 103 used as a cleavage plane. Also, the thermal treatment is preferably performed at a temperature ranging from the temperature at which the bonding layer 104 is formed to the upper temperature limit of the base substrate 100. When the thermal treatment is performed at, for example, from 400 to 600° C., a change occurs in the volume of minute voids formed in the embrittlement layer 103, which enables cleavage to occur along the embrittlement layer 103. Because the bonding layers 104 are bonded to the base substrate 100, the LTSS layers 102 having the same crystallinity as the semiconductor substrate 101 and the bonding layers 104 which are island-shaped are left on the base substrate 100, and the LTSS layers 102 and the bonding layers 104 form the element formation patterns 301 and the dummy patterns 302.

As described above, even when the surface to be bonded has unevenness on its surface, dummy patterns are formed between steps at given intervals, and thus the warp of the bonded substrate can be suppressed, and the adhesion between the substrates can be secured, so that an SOI layer having a desired shape can be obtained.

Figure 3C:
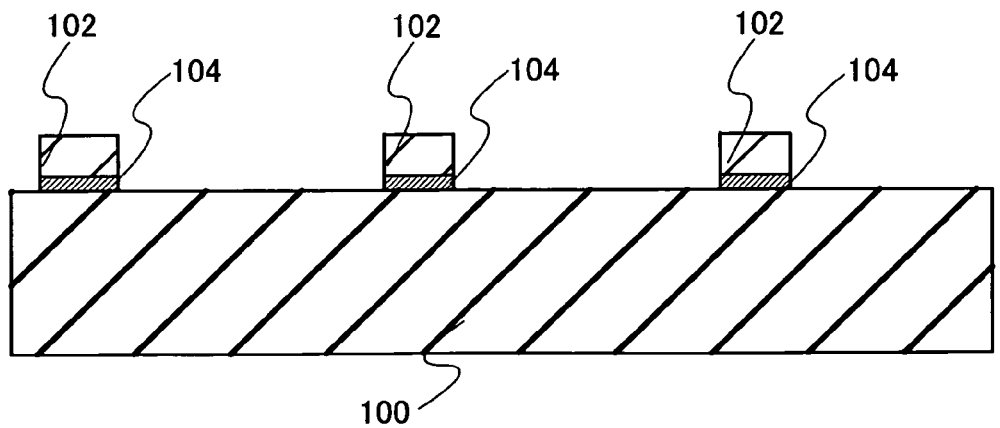

The dummy patterns 302 are not used in forming an element, and as necessary, as illustrated in FIG. 3C, the dummy patterns may be removed by a general photolithography technique and a general etching technique. Through the above steps, the semiconductor substrate illustrated in FIG. 1A can be formed.

Figure 4A:
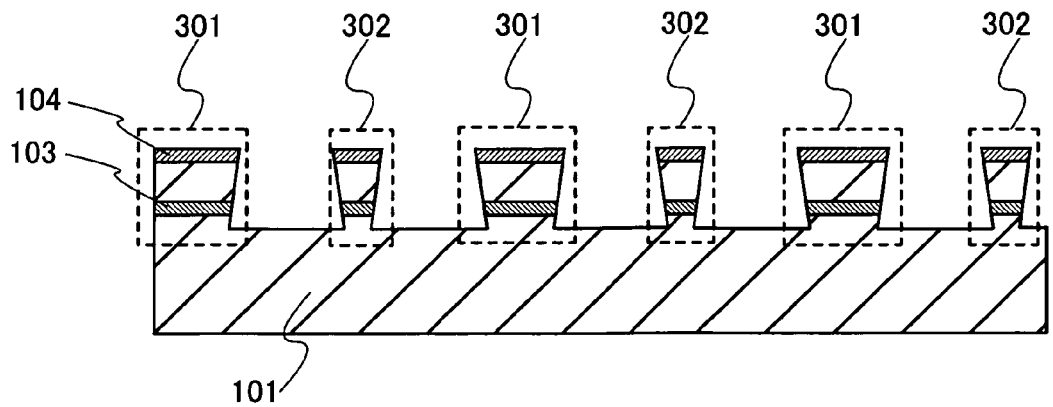
FIGS. 4A to 4C are cross-sectional views illustrating a manufacturing method of a semiconductor substrate in Embodiment Mode 1 of the present invention.
Figure 4B:
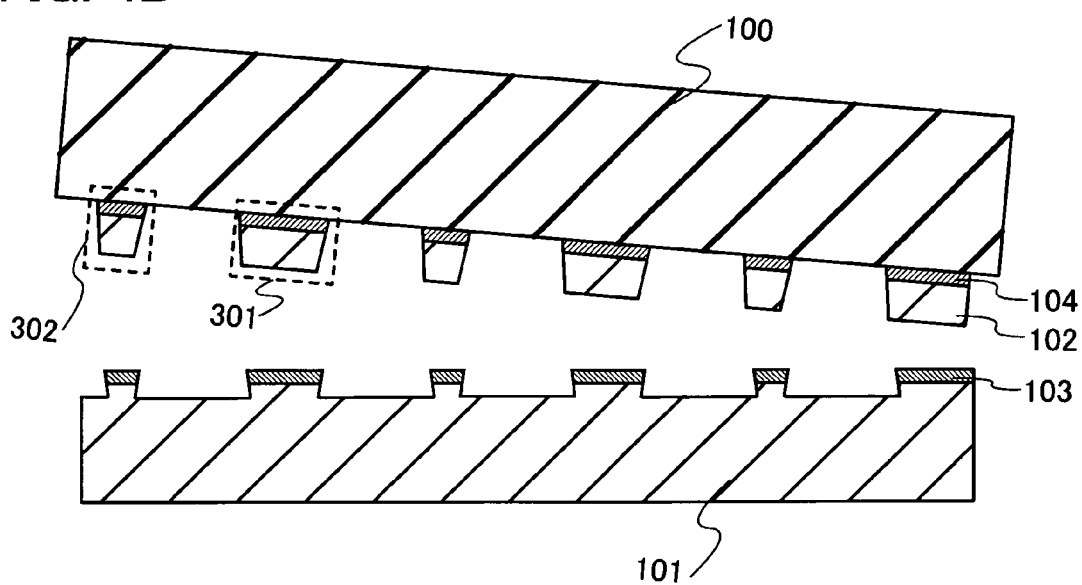
Figure 4C:
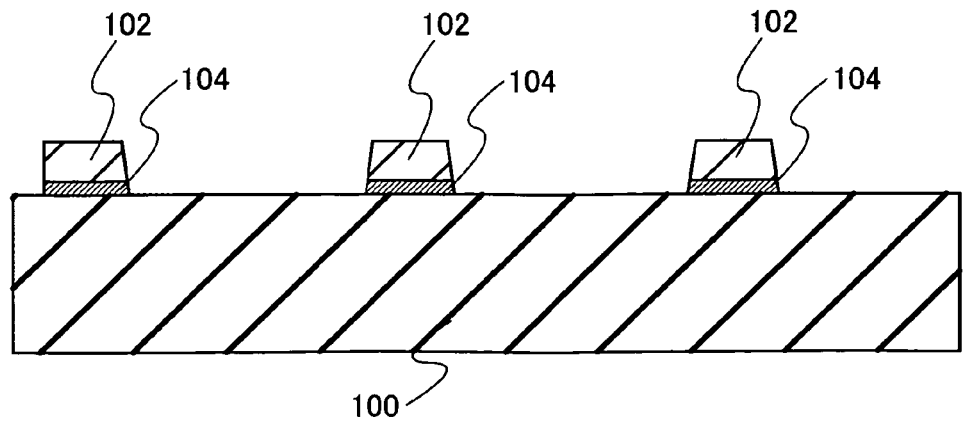

An example in which the side face in the cross-sectional shape of the pattern of the LTSS layer 102 is almost perpendicular has been shown above; however, as illustrated in FIG. 4A, the element formation patterns 301 and the dummy patterns 302 are formed to have inversely tapered shape on the semiconductor substrate 101. Then, as illustrated in FIG. 4B, the base substrate 100 is bonded to the patterns having inversely tapered shapes and separated therefrom in a similar manner to that of FIG. 3B, so that the LTSS layers 102 having tapered shapes can be formed on the base substrate 100 as illustrated in FIG. 4C. When elements are formed using the LTSS layers having tapered shapes, a coverage for a film to be formed over the LTSS layer 102 is improved, which is preferable.

The example of forming the bonding layer 104 is described above. However, if the bond strength between the base substrate 100 and the LTSS layers 102 is sufficient, the bonding layer 104 is not necessarily formed, and the base substrate 100 and the LTSS layer 102 may be directly bonded to each other.

The example in which the element formation patterns 301 and the dummy patterns 302 are formed after forming the embrittlement layer 103 is shown above. However, the embrittlement layer 103 may be formed after forming the element formation patterns 301 and the dummy patterns 302.

In a case where a semiconductor substrate provided with the barrier layer 105 and the bonding layer 104 formed on the base substrate 100 as illustrated in FIG. 1B is manufactured, the barrier layer 105 and the bonding layer 104 are provided on the base substrate 100, and the base substrate 100 is closely attached so as to be bonded to the surface of the semiconductor substrate 101 on which the bonding layer 104 is formed. The other steps can be manufactured in the same manner as above.

As the base substrate 100, it is possible to use any of a variety of glass substrates that are used in the electronics industry and that are referred to as non-alkali glass substrates, such as aluminosilicate glass, aluminoborosilicate glass, and barium borosilicate glass. Thus, a single crystal semiconductor layer can be formed over a substrate that is longer than one meter on a side. With the use of such a large-area substrate, not only a display device such as a liquid crystal display or an EL display device but also a semiconductor integrated circuit can be manufactured.

Embodiment Mode 2

Embodiment Mode 2 will describe an example in which an LTSS layer having a different pattern is formed on the semiconductor substrate formed in Embodiment Mode 1. FIGS. 5A to 5C and FIGS. 6A to 6C illustrate a manufacturing method thereof.

Figure 5A:
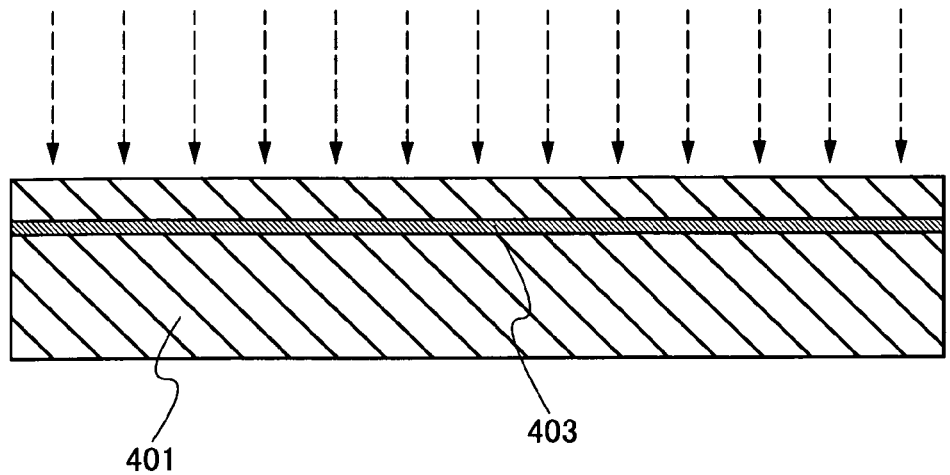
FIGS. 5A to 5C are cross-sectional views illustrating a manufacturing method of a semiconductor substrate in Embodiment Mode 2 of the present invention.

A semiconductor substrate 401 shown in FIG. 5A is cleaned, and the semiconductor substrate 401 is irradiated with ions accelerated by an electric field from a surface thereof to form an embrittlement layer 403 at a predetermined depth in the semiconductor substrate 401. The ion irradiation is conducted in consideration of the thickness of the LTSS layer transferred to a base substrate. The thickness of the LTSS layer is set to be 5 nm to 500 nm, preferably 10 nm to 200 nm. The accelerating voltage in irradiating the semiconductor substrate 401 with ions is set in consideration of such a thickness. The embrittlement layer 403 is formed by irradiation with ions of hydrogen, an inert gas typified by helium, or ions of halogen typified by fluorine.

Because there is need for irradiation with ions at a high dose in forming the embrittlement layer 403, there are cases where the surface of the semiconductor substrate 401 is roughened. Therefore, a protective film against ion irradiation, such as a silicon oxide, a silicon nitride film or a silicon nitride oxide film, may be provided to a thickness of 0.5 nm to 200 nm over a surface irradiated with ions.

Figure 5B:
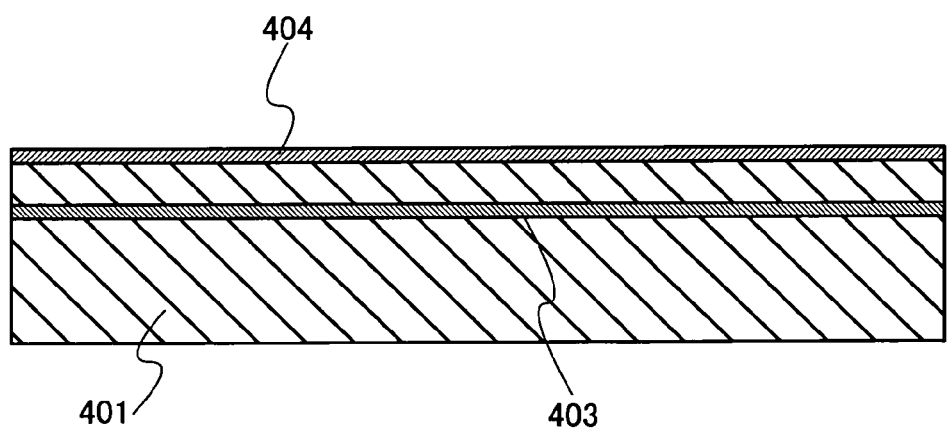

Next, as shown in FIG. 5B, a silicon oxide film is formed as a bonding layer 404 on a surface that is to form a bond with the base substrate. As the silicon oxide film, a silicon oxide film formed by a chemical vapor deposition method using an organic silane gas is preferable as described above. Alternatively, a silicon oxide film formed by a chemical vapor deposition method using a silane-based gas such as a silane gas, a disilane gas, or a trisilane gas can be applied. Film formation by a chemical vapor deposition method is performed at a formation temperature of, for example, 350° C. or lower, as a temperature at which degasification does not occur in the embrittlement layer 403 that is formed in the single crystal semiconductor substrate. Further, thermal treatment for separation of the LTSS layer from a single crystal semiconductor substrate or a polycrystalline semiconductor substrate is performed at higher temperature than a temperature at which the silicon oxide film is formed. As a chemical vapor deposition method, any method of plasma CVD, thermal CVD and photo CVD may be used. Alternatively, the silicon oxide film may be a thermal oxide film, and in particular, a thermal oxide film including chlorine or fluorine is preferable.

Figure 5C:
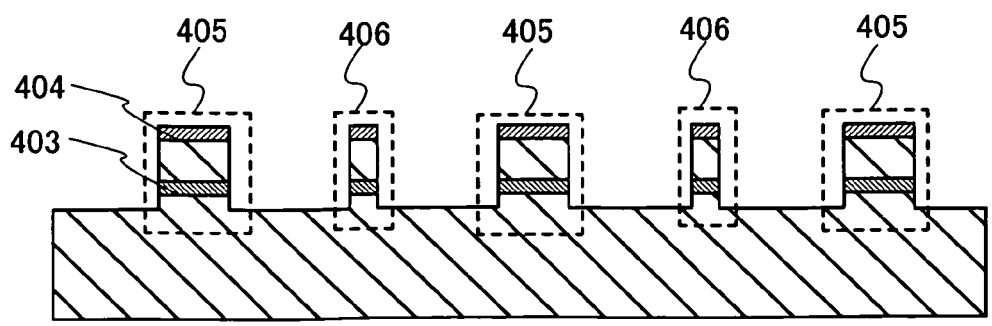

Next, as illustrated in FIG. 5C, the semiconductor substrate 401 having the embrittlement layer 403 and the bonding layer 404 is patterned into a desired shape. At that time, element formation patterns 405 which are used in forming elements and dummy patterns 406 which are not used in forming the elements, are formed at predetermined intervals. Note that the element formation patterns 405 and the dummy patterns 406 are arranged such that they do not overlap with the LTSS layers 102 over the base substrate 100. The patterning can be conducted by etching the bonding layer 404, the semiconductor substrate 401 and the embrittlement layer 403 in the other region than the element formation patterns 405 and the dummy patterns 406 by a general photolithography technique and a general etching technique. Also in that case, by inversely taper etching, the same pattern as that illustrated in FIG. 4C can be formed. For the depth for etching, the depth to the embrittlement layer 403 is sufficient, but it is preferable that the semiconductor substrate 401 under the embrittlement layer 403 is slightly etched to completely remove the embrittlement layer 403 which should be removed.

Figure 6A:
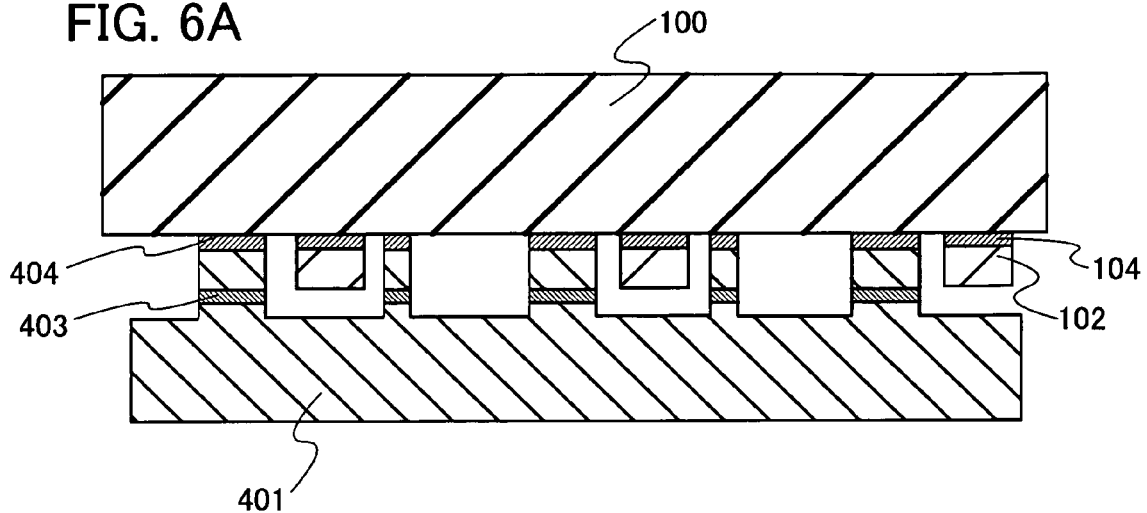
FIGS. 6A to 6C are cross-sectional views illustrating a manufacturing method of a semiconductor substrate in Embodiment Mode 2 of the present invention.

As illustrated in FIG. 6A, the base substrate 100 provided with island-shaped LTSS layers 102 obtained in Embodiment Mode 1 is disposed in close contact with the bonding layers 404 formed on the semiconductor substrate 401 such that the base substrate 100 and the bonding layers 404 are bonded to each other. At this time, the bonding is conducted such that the LTSS layers 102 formed on the base substrate 100 and the element formation patterns 405 and the dummy pattern 406 on the semiconductor substrate 401 do not overlap with each other. Surfaces that are to form a bond are cleaned sufficiently. By disposing the base substrate 100 in close contact with the bonding layers 404, a bond is formed therebetween. This bond is made by Van der Waals forces. By pressing the base substrate 100 and the semiconductor substrate 401, a stronger bond can be formed by hydrogen bond.

In bonding, if the dummy patterns 406 do not exist and the interval between the plural element formation patterns 405 is large, the base substrate 100 may warp, and the bonding area becomes small, so that the strong bonding by the hydrogen bond as described above cannot be obtained easily. By providing the dummy patterns 406 between the plural element formation patterns 405, the warp of the base substrate 100 is suppressed, the adhesion between the base substrate 100 and the semiconductor substrate 401 can be secured, and a strong bond can be realized. For example, when the base substrate 100 is a glass substrate having a thickness of 700 μm, if the interval between plural islands is 200 μm or wider, the substrate may warp. Thus, in this case, the dummy patterns 406 should be arranged appropriately such that the intervals between the dummy patterns 406 be not larger than 200 μm.

The dummy patterns 406 are arranged at such an interval that can suppress the warp of the base substrate 101 and secure the adhesion between the base substrate 100 and the semiconductor substrate 401, depending on the material or the thickness of the base substrate 100.

In order to form a favorable bond, the surface may be activated. For example, the surface that is to form a bond is irradiated with an atomic beam or an ion beam. When an atomic beam or an ion beam is used, an inert gas neutral atom beam or inert gas ion beam of argon or the like can be used. Alternatively, plasma irradiation or radical treatment is performed. RIE (Reactive Ion Etching) mode plasma treatment using at least one of oxygen, nitrogen and argon, or a mixture gas including at least one of oxygen, nitrogen and argon may be conducted. Such a surface treatment makes it easier to form a bond between different kinds of materials even at a temperature of from 200° C. to 400° C.

After the base substrate 100 and the semiconductor substrate 401 are bonded to each other with the bonding layer 404 interposed therebetween, it is preferable that thermal treatment or pressure treatment be performed. Thermal treatment or pressure treatment makes it possible to increase Van der Waals forces, increase the density of hydrogen bond, or change Van der Waals forces into a covalent bond, so that the bond strength can be increased. The thermal treatment is preferably performed at a temperature lower than the upper temperature limit of the base substrate 100. The pressure treatment is performed so that pressure is applied in a direction perpendicular to the bonding surface, in consideration of the pressure resistance of the base substrate 100 and the semiconductor substrate 401.

Figure 6B:
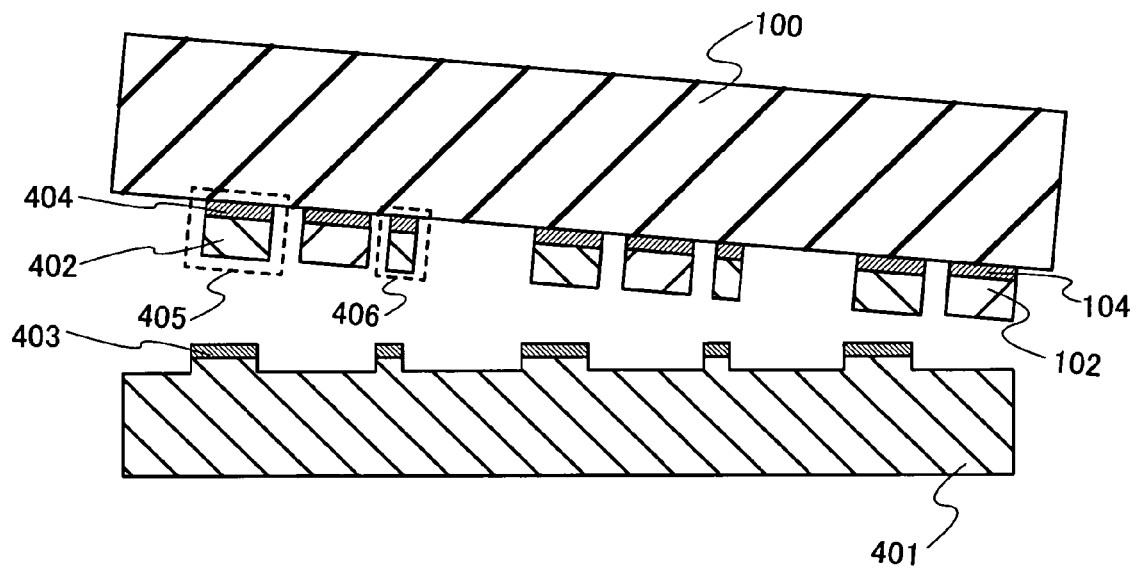

In FIG. 6B, after the base substrate 100 provided with the LTSS layers 102, and the semiconductor substrate 401 are bonded to each other, thermal treatment is performed to separate the semiconductor substrate 401 from the base substrate 100 with the embrittlement layer 403 used as a cleavage plane. The thermal treatment is preferably performed at a temperature ranging from the temperature at which the bonding layer 404 is formed to the upper temperature limit of the base substrate 100. When the thermal treatment is performed at, for example, 400° C. to 600° C., a change occurs in the volume of minute voids formed in the embrittlement layer 403, which enables cleavage to occur along the embrittlement layer 403. Because the bonding layers 404 are bonded to the base substrate 100, the LTSS layers 402 having the same crystallinity as the semiconductor substrate 401 and the bonding layers 404 which are island-shaped are left on the base substrate 100 provided with the LTSS layers 102, and the LTSS layers 402 and the bonding layers 404 form the element formation patterns 405 and the dummy patterns 406.

Figure 6C:
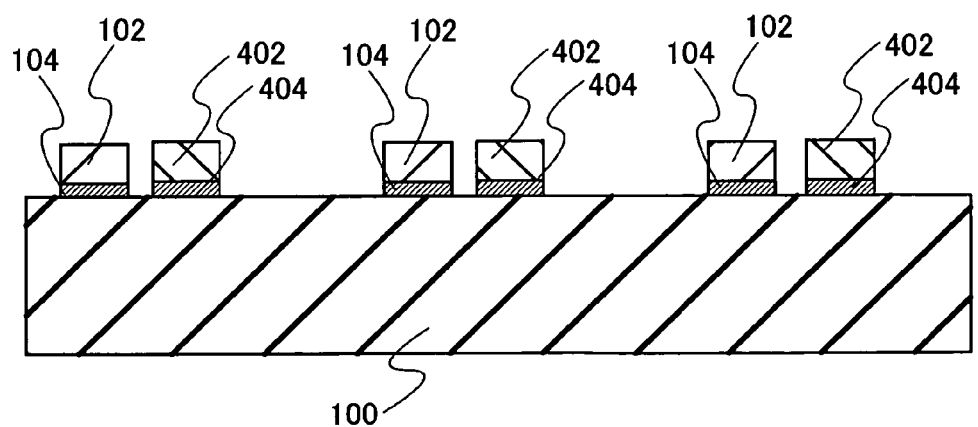

Since the dummy patterns 406 are not used in forming elements, as illustrated in FIG. 6C, the dummy patterns may be removed by a general photolithography technique and a general etching technique.

The example of forming the bonding layer 404 is described above. However, if the bond strength between the base substrate 100 and the LTSS layer 402 is sufficient, the bonding layer 404 is not necessarily formed, and the base substrate 100 and the LTSS layer 402 may be directly bonded.

The example in which the element formation patterns 405 and the dummy patterns 406 are formed after forming the embrittlement layer 403 is shown above. However, the embrittlement layer 403 may be formed after forming the element formation patterns 405 and the dummy patterns 406.

Note that the dummy patterns 302 used in Embodiment Mode 1 may be formed on the base substrate 100 used in this embodiment mode.

In addition, the thickness of the LTSS layer 402 formed in this embodiment mode is preferably thicker than the LTSS layer 102 used in Embodiment Mode 1.

Also in this embodiment mode, in a case where the semiconductor substrate in which the barrier layer 105 and the bonding layer 104 are provided for the base substrate 100 as illustrated in FIG. 1B of Embodiment Mode 1, the barrier layer 105 and the bonding layer 104 are provided on the base substrate 100, and the base substrate 100 is closely attached so as to be bonded to the surface of the semiconductor substrate 401 on which the bonding layer 404 is formed. The other steps can be manufactured in the same manner as above.

As the base substrate 100, it is possible to use any of a variety of glass substrates that are used in the electronics industry and that are referred to as non-alkali glass substrates, such as aluminosilicate glass, aluminoborosilicate glass, and barium borosilicate glass. In other words, a single crystal semiconductor layer can be formed over a substrate that is longer than one meter on a side. With the use of such a large-area substrate, not only a display device such as a liquid crystal display or an EL display device but also a semiconductor integrated circuit can be manufactured.

Through the above steps, the LTSS layers 102 and 402 can be formed on the same base substrate 100 from the separate semiconductor substrates 101 and 401. For example, when the semiconductor substrate 101 has a crystal face {100} and the semiconductor substrate 401 has a crystal face {110}, the LTSS layer 102 having a crystal face {100} and the LTSS layer 402 having a crystal face {110} can be formed with desired patterns on the same substrate. In the single crystal having a crystal face {100}, the mobility of electrons is high. Thus, an n-channel thin film transistor is preferably formed using the LTSS layer 102 such that electrons in a channel region move in <100> direction. Similarly, in the single crystal having a crystal face {110}, the mobility of holes is high. Thus, a p-channel thin film transistor is preferably formed using the LTSS layer 402 such that holes in a channel region move in <110> direction.

The example in which the LTSS layer having a different pattern is formed on the semiconductor substrate formed in Embodiment Mode 1 is described above. However, this embodiment mode is not limited to the semiconductor substrate formed in the steps shown in Embodiment Mode 1, and it is also possible that on a semiconductor substrate having a patterned LTSS layer, an LTSS layer having a different pattern is formed. For example, on the semiconductor substrate provided with the LTSS layer having a pattern formed in the steps as illustrated in FIGS. 7A to 7C and FIGS. 8A and 8B, the LTSS layer having a different pattern illustrated in FIGS. 5A to 5C and FIGS. 6A to 6C can be formed. The process in that case is described below.

Figure 7A:
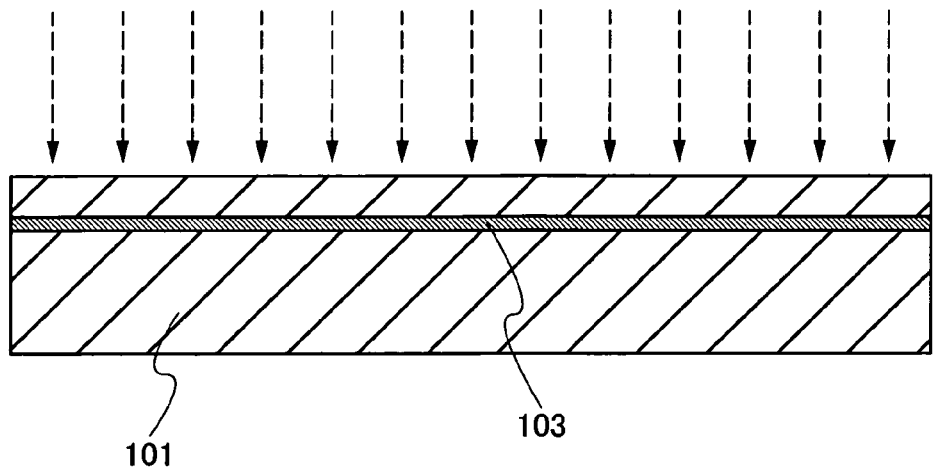
FIGS. 7A to 7C are cross-sectional views illustrating a manufacturing method of a semiconductor substrate in Embodiment Mode 2 of the present invention.

The semiconductor substrate 101 shown in FIG. 7A is cleaned, and the semiconductor substrate 101 is irradiated with ions accelerated by an electric field from a surface thereof to form the embrittlement layer 103 in the semiconductor substrate 101 at a predetermined depth. The ion irradiation is conducted in consideration of the thickness of the LTSS layer transferred to a base substrate. The thickness of the LTSS layer is set to be 5 nm to 500 nm, preferably 10 nm to 200 nm. The accelerating voltage in irradiating the semiconductor substrate 101 with ions is set in consideration of such a thickness. The embrittlement layer 103 is formed by irradiation with ions of hydrogen, an inert gas typified by helium, or halogen typified by fluorine.

Because there is need for irradiation with ions at a high dose in forming the embrittlement layer 103, there are cases where the surface of the semiconductor substrate 101 is roughened. Therefore, a protective film against ion irradiation, such as a silicon oxide, a silicon nitride film or a silicon nitride oxide film, may be formed to a thickness of 0.5 nm to 200 nm over a surface irradiated with ions.

Figure 7B:
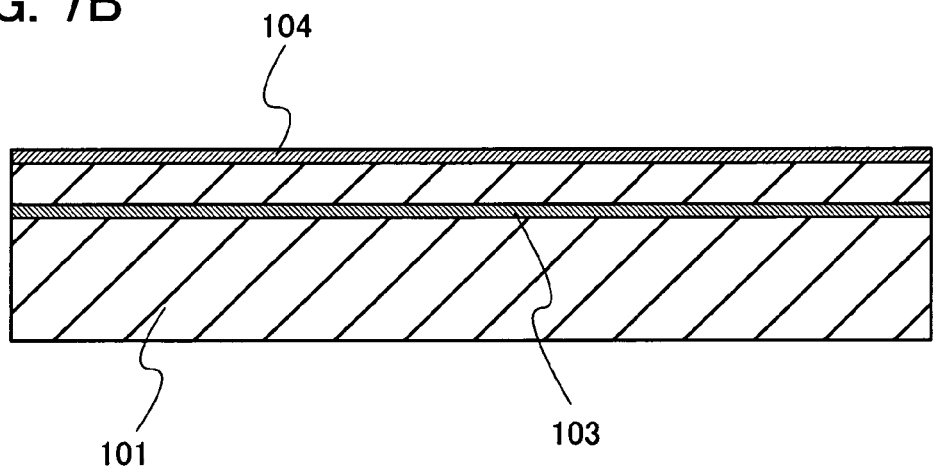

Next, as shown in FIG. 7B, a silicon oxide film is formed as the bonding layer 104 over a surface that is to form a bond with the base substrate. The silicon oxide film is preferably formed by a chemical vapor deposition method using an organic silane gas as described above. Alternatively, a silicon oxide film formed by a chemical vapor deposition method using a silane-based gas such as a silane gas, a disilane gas, or a trisilane gas can be used. Film formation by a chemical vapor deposition method is performed at a formation temperature of, for example, 350° C. or lower, as a temperature at which degasification does not occur in the embrittlement layer 103 that is formed in the single crystal semiconductor substrate. Further, thermal treatment for separation of the LTSS layer from a single crystal semiconductor substrate or a polycrystalline semiconductor substrate is performed at higher temperature than a temperature at which the silicon oxide film is formed. As a chemical vapor deposition method, any method of plasma CVD, thermal CVD and photo CVD may be used. Further, the silicon oxide film may be a thermal oxidation film, and in particular, a thermal oxidation film including chlorine or fluorine is preferable.

Figure 7C:
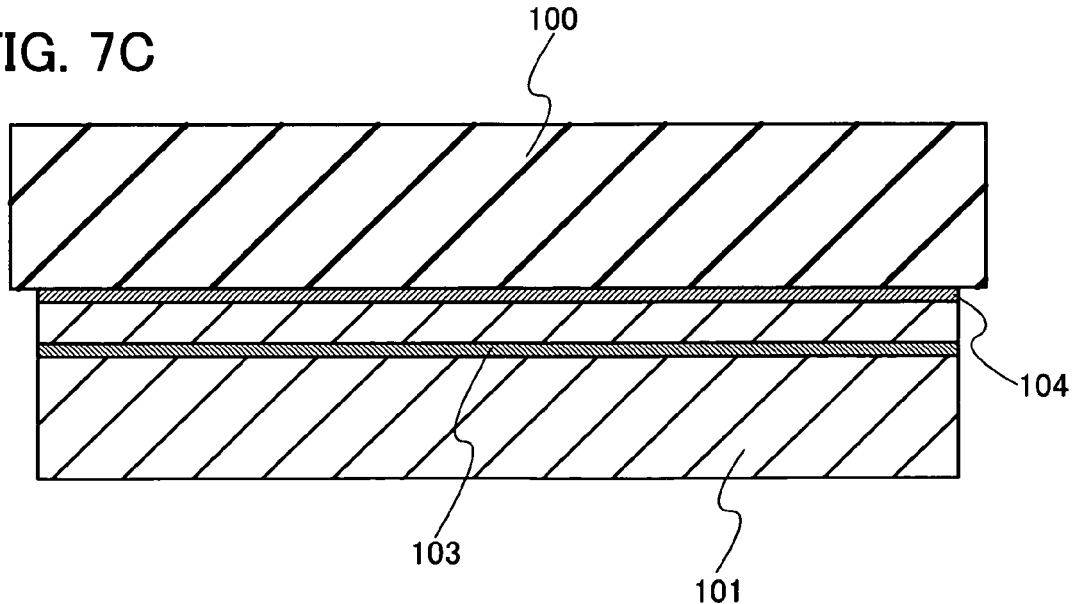

FIG. 7C illustrates a mode in which the base substrate 100 is disposed in close contact with the bonding layer 104 formed on the semiconductor substrate 101 such that the base substrate 100 and the bonding layer 104 are bonded. Surfaces that are to form a bond are cleaned sufficiently. By disposing the base substrate 100 in contact with the bonding layer 104, a bond is formed therebetween. This bond is made by Van der Waals forces. By pressing the base substrate 100 and the semiconductor substrate 101, a stronger bond can be formed by hydrogen bond.

In order to form a favorable bond, the surface may be activated. For example, the surface that is to form a bond is irradiated with an atomic beam or an ion beam. When an atomic beam or an ion beam is used, an inert gas neutral atom beam or inert gas ion beam of argon or the like can be used. Alternatively, plasma irradiation or radical treatment is performed. RIE (Reactive Ion Etching) mode plasma treatment using at least one of oxygen, nitrogen and argon, or a mixture gas including at least one of oxygen, nitrogen and argon may be conducted. Such a surface treatment makes it easier to form a bond between different kinds of materials even at a temperature of from 200° C. to 400° C.

After the base substrate 100 and the semiconductor substrate 101 are bonded to each other with the bonding layer 104 interposed therebetween, it is preferable that thermal treatment or pressure treatment be performed. Thermal treatment or pressure treatment makes it possible to increase Van der Waals forces, increase the density of hydrogen bond, or change Van der Waals forces into a covalent bond, so that the bond strength can be increased. The thermal treatment is preferably performed at a temperature lower than the upper temperature limit of the base substrate 100. The pressure treatment is performed so that pressure is applied in a direction perpendicular to the bonding surface, in consideration of the pressure resistance of the base substrate 100 and the semiconductor substrate 101.

Figure 8A:
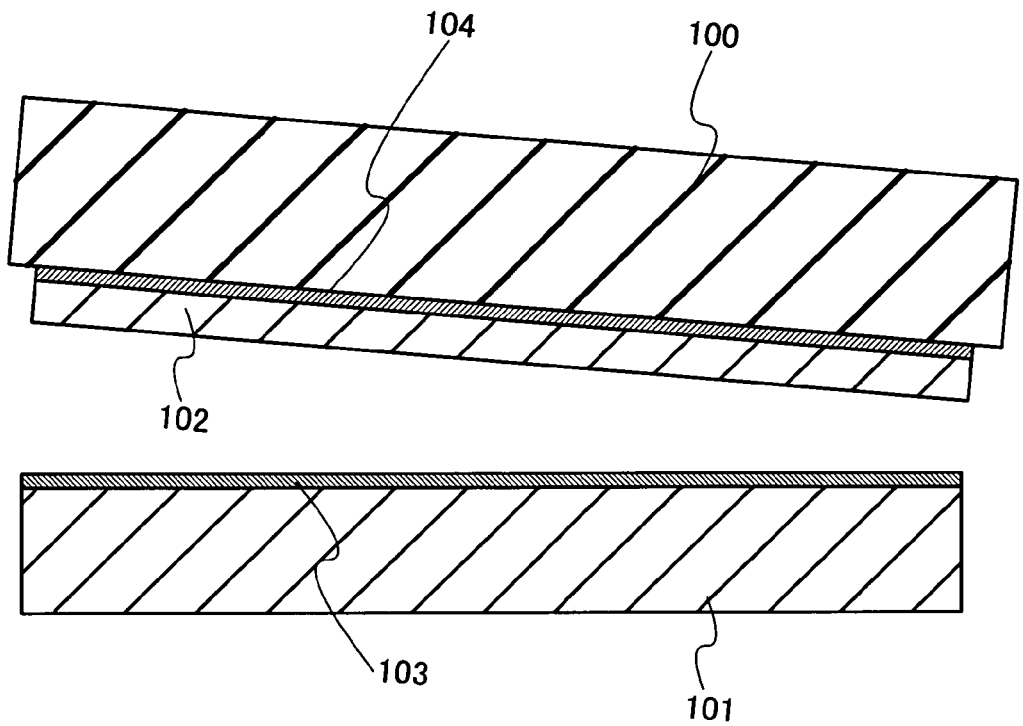
FIGS. 8A and 8B are cross-sectional views illustrating a manufacturing method of a semiconductor substrate in Embodiment Mode 2 of the present invention.

In FIG. 8A, after the base substrate 100 and the semiconductor substrate 101 are bonded together, thermal treatment is performed to separate the semiconductor substrate 101 from the base substrate 100 with the embrittlement layer 103 used as a cleavage plane. Also, the thermal treatment is preferably performed at a temperature ranging from the temperature at which the bonding layer 104 is formed to the upper temperature limit of the base substrate 100. When the thermal treatment is performed at, for example, from 400° C. to 600° C., a change occurs in the volume of minute voids formed in the embrittlement layer 103, which enables cleavage to occur along the embrittlement layer 103. Because the bonding layer 104 is bonded to the base substrate 100, the LTSS layer 102 having the same crystallinity as the semiconductor substrate 101 is left on the base substrate 100.

Figure 8B:
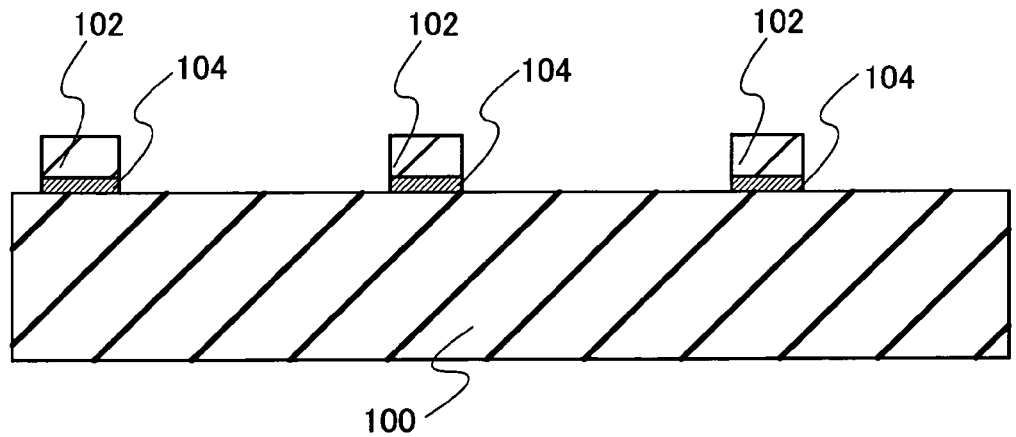

Next, as illustrated in FIG. 8B, the LTSS layer 102 and the bonding layer 104 are patterned into desired shapes. The patterning can be conducted by etching the LTSS layer 102 and the bonding layer 104 in the other region than the desired patterns by a general photolithography technique and a general etching technique. In that case, by forwardly taper etching, the same pattern as that illustrated in FIG. 4C can be formed.

By using the base substrate having the LTSS layers 102 which are patterned as illustrated in FIG. 8B, LTSS layers 402 which are differently patterned can be formed in the process as described with reference to FIGS. 6A to 6C.

Note that when the LTSS layers 102 are formed, if element formation patterns which are used in a later element formation step and dummy patterns which are not used in a later element formation step, are formed first, the dummy patterns 406 are not needed to be formed in the step of forming the LTSS layers 402 later. In this case, instead of forming the dummy patterns 406, the dummy patterns formed in the step of forming the LTSS layers 102 can suppress the warp of the base substrate 100.

Embodiment Mode 3

Figure 9A:
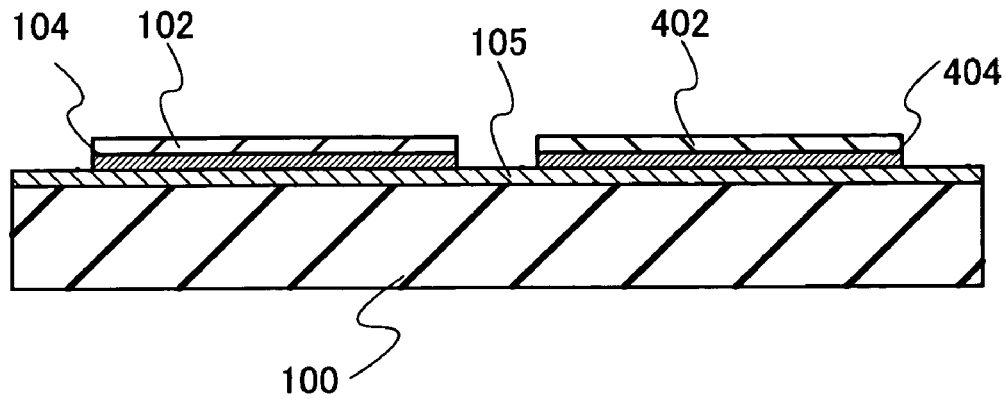
FIGS. 9A to 9C are cross-sectional views illustrating a manufacturing method of a semiconductor device using a semiconductor substrate in Example of the present invention.

Embodiment Mode 3 will describe a manufacturing method of a semiconductor device using the semiconductor substrate formed in Embodiment Mode 2 with reference to FIGS. 9A to 9C and 10A and 10B. In FIG. 9A, an island-shaped LTSS layer 102 having a crystal face {100} is provided over the base substrate 100 with the barrier layer 105 and the bonding layer 104 interposed therebetween and an island-shaped LTSS layer 402 having a crystal face {110} is provided over the base substrate 100 with the barrier layer 105 and the bonding layer 404 interposed therebetween. The thicknesses of the LTSS layers 102 and 402 are from the 5 nm to 500 nm, preferably 10 nm to 200 nm. The thicknesses of the LTSS layers 102 and 402 can be set as appropriate by controlling the depths of the embrittlement layers 103 and 403 described with reference to FIGS. 2A and 5A.

A gate insulating layer 109, a gate electrode 110, and a sidewall insulating layer 111 are formed, and a first impurity region 112 and a second impurity region 113 are formed on the LTSS layer 102. A gate insulating layer 609, a gate electrode 610, and a sidewall insulating layer 611 are formed, and a first impurity region 612 and a second impurity region 613 are formed on the LTSS layer 402. Insulating layers 114 and 614 are formed from silicon nitride and used as a hard mask when the gate electrodes 110 and 610 are etched.

Figure 9B:
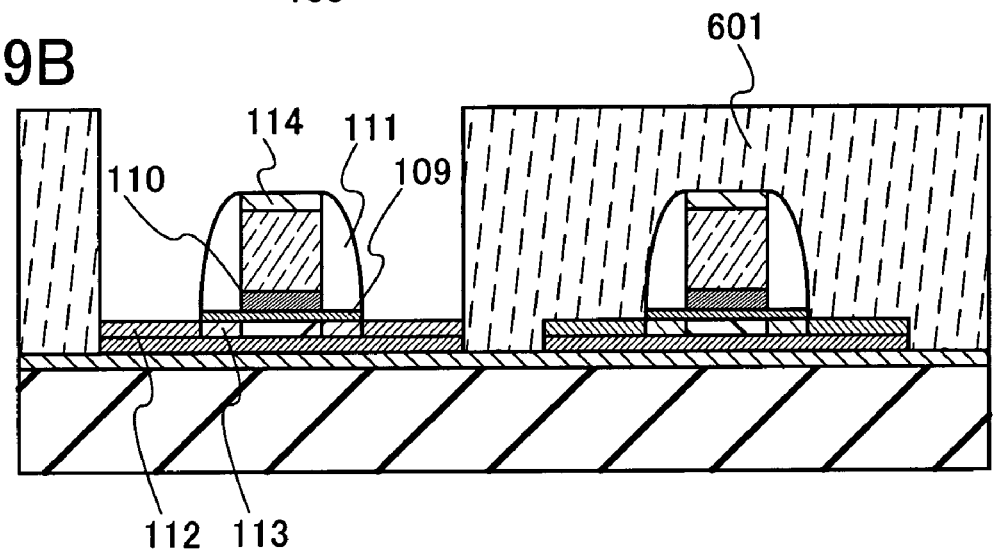
Figure 9C:
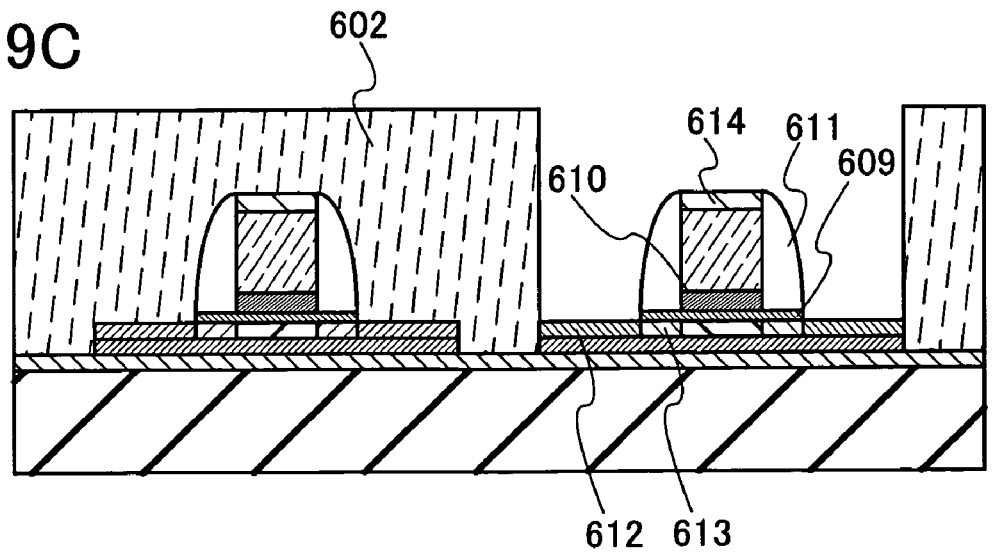

When a conductivity of the thin film transistor using the LTSS layer 102 is to be n-type, the thin film transistor using the LTSS layer 402 is covered by a resist layer 601, and then an impurity which imparts n-type conductivity may be added to the thin film transistor using the LTSS layer 102 as shown in FIG. 9B. In addition, when a conductivity of the thin film transistor using the LTSS layer 402 is to be p-type, the thin film transistor using the LTSS layer 102 is covered by a resist layer 602, and then an impurity which imparts p-type conductivity may be added to the thin film transistor using the LTSS layer 402 as shown in FIG. 9C.

Figure 10A:
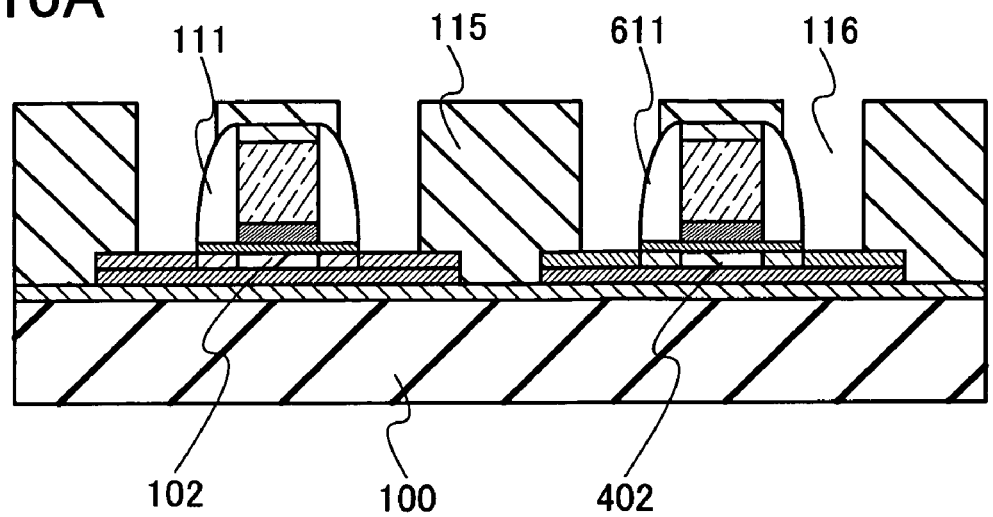
FIGS. 10A and 10B are cross-sectional views illustrating a manufacturing method of a semiconductor device using a semiconductor substrate in Example of the present invention.

In FIG. 10A, an interlayer insulating layer 115 is formed. As the interlayer insulating layer 115, a borophosphosilicate glass (BPSG) film is formed or an organic resin typified by polyimide is applied. Contact holes 116 are formed in the interlayer insulating layer 115. The contact holes 116 are formed with a self-aligned contact structure due to the sidewall insulating layers 111 and 611.

Figure 10B:
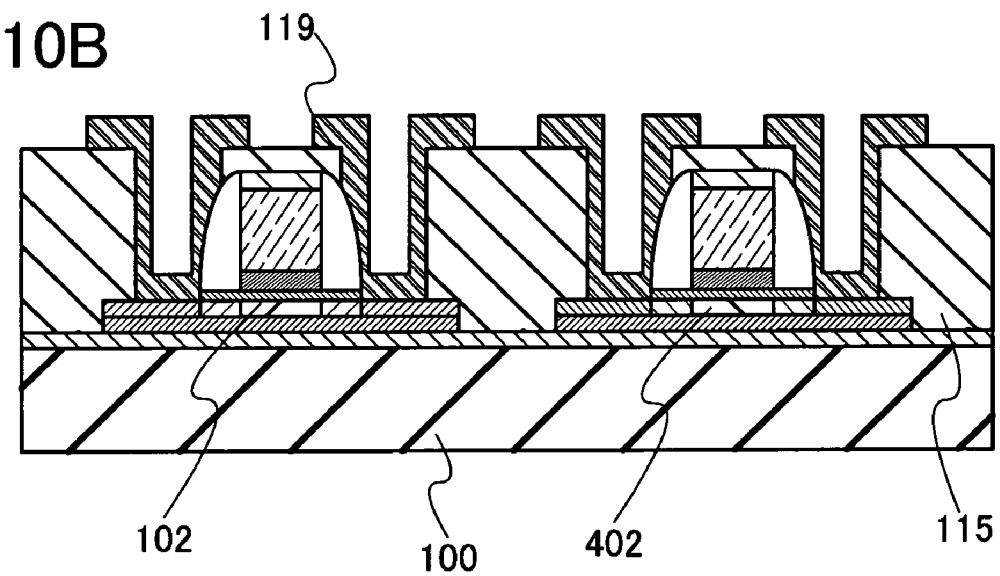

After that, as shown in FIG. 10B, wirings 119 are formed to match the contact holes 116. The wirings 119 are formed from aluminum or an aluminum alloy and are provided with upper and lower metal films of molybdenum, chromium, titanium, or the like as barrier metal films.

In this manner, a n-channel field-effect transistor and a p-channel field-effect transistor can be manufactured using the LTSS layer 102 having a crystal face {100} and the LTSS layer 402 having a crystal face {110} that are bonded to the base substrate 100. Because the LTSS layers 102 and 402 formed according to this embodiment mode are each a single crystal semiconductor with uniform crystal orientation, a homogeneous and high-performance field-effect transistor can be obtained. In other words, it is possible to suppress inhomogeneity of values of important transistor characteristics, such as threshold voltage and mobility, and to achieve high performance such as high mobility.

EXAMPLE 1

Figure 11:
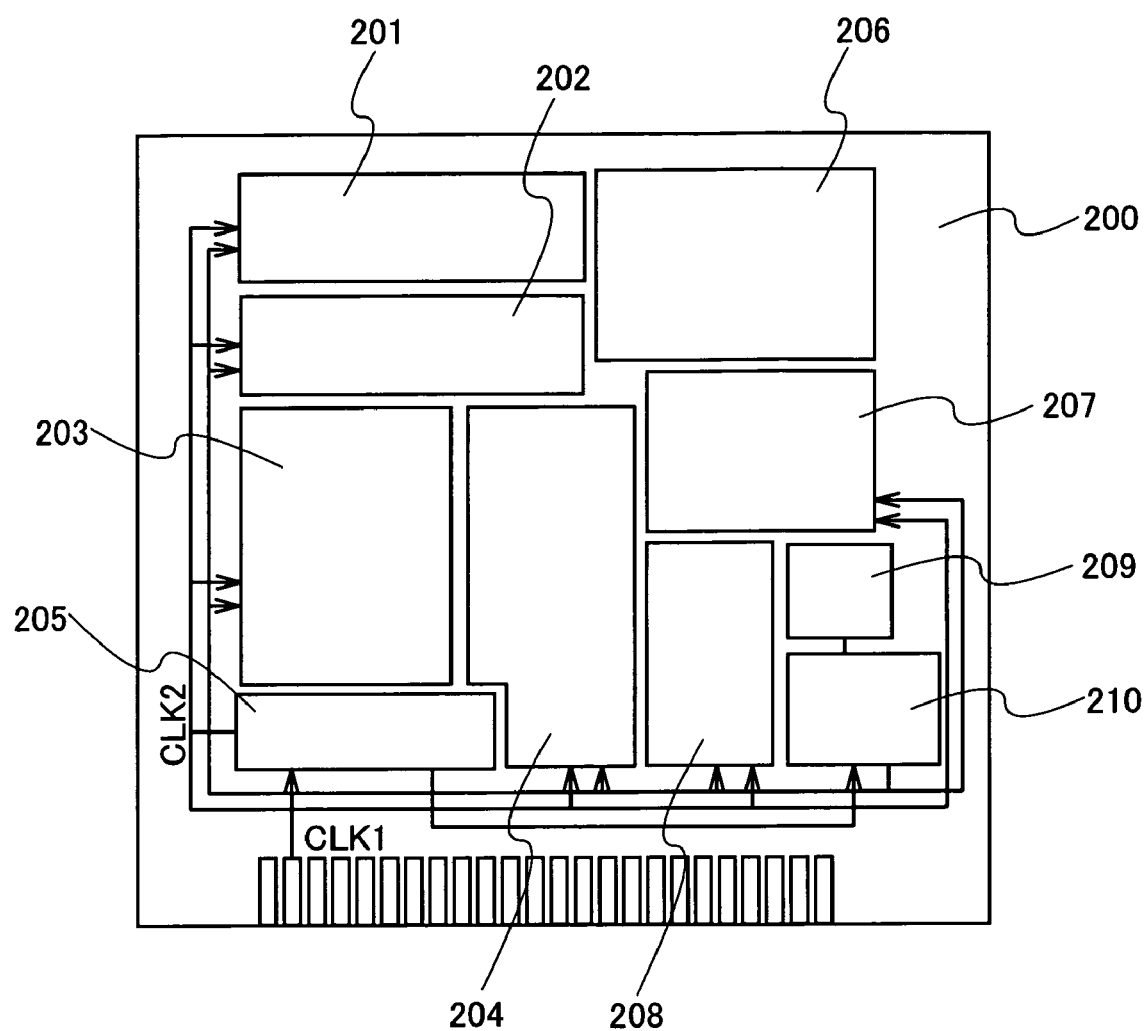
FIG. 11 is a block diagram of a structure of a microprocessor obtained by using a semiconductor substrate in Example of the present invention.

An example of a semiconductor device using a semiconductor substrate according to the present invention is described with reference to drawings. FIG. 11 shows an example of a microprocessor 200 as an example of the semiconductor device. The microprocessor 200 is manufactured using the semiconductor substrate formed according to Embodiment Modes as described above. The microprocessor 200 has an arithmetic logic unit (ALU) 201, an ALU controller 202, an instruction decoder 203, an interrupt controller 204, a timing controller 205, a register 206, a register controller 207, a bus interface (Bus I/F) 208, a read-only memory 209, and a memory interface (ROM I/F) 210.

An instruction input to the microprocessor 200 through the bus interface 208 is input to the instruction decoder 203, decoded therein, and then input to the ALU controller 202, the interrupt controller 204, the register controller 207, and the timing controller 205. The ALU controller 202, the interrupt controller 204, the register controller 207, and the timing controller 205 conduct various controls based on the decoded instruction. Specifically, the ALU controller 202 generates signals for controlling the operation of the ALU 201. While the microprocessor 200 is executing a program, the interrupt controller 204 processes an interrupt request from an external input/output device or a peripheral circuit based on its priority or a mask state. The register controller 207 generates an address of the register 206, and reads and writes data from and to the register 206 in accordance with the state of the microprocessor 200. The timing controller 205 generates signals for controlling timing of operation of the ALU 201, the ALU controller 202, the instruction decoder 203, the interrupt controller 204, and the register controller 207. For example, the timing controller 205 is provided with an internal clock generator for generating an internal clock signal CLK2 based on a reference clock signal CLK1, and supplies the clock signal CLK2 to the various above-mentioned circuits. Obviously, the microprocessor 200 shown in FIG. 11 is just an example in which the configuration is simplified, and an actual microprocessor may have a variety of configurations depending on the uses.

The microprocessor 200 like this can achieve not only an increase in processing speed but also a reduction in power consumption because an integrated circuit is formed using a single crystal semiconductor layer (LTSS layer) with uniform crystal orientation which is bonded on a substrate having an insulating surface or an insulating substrate.

Figure 12:
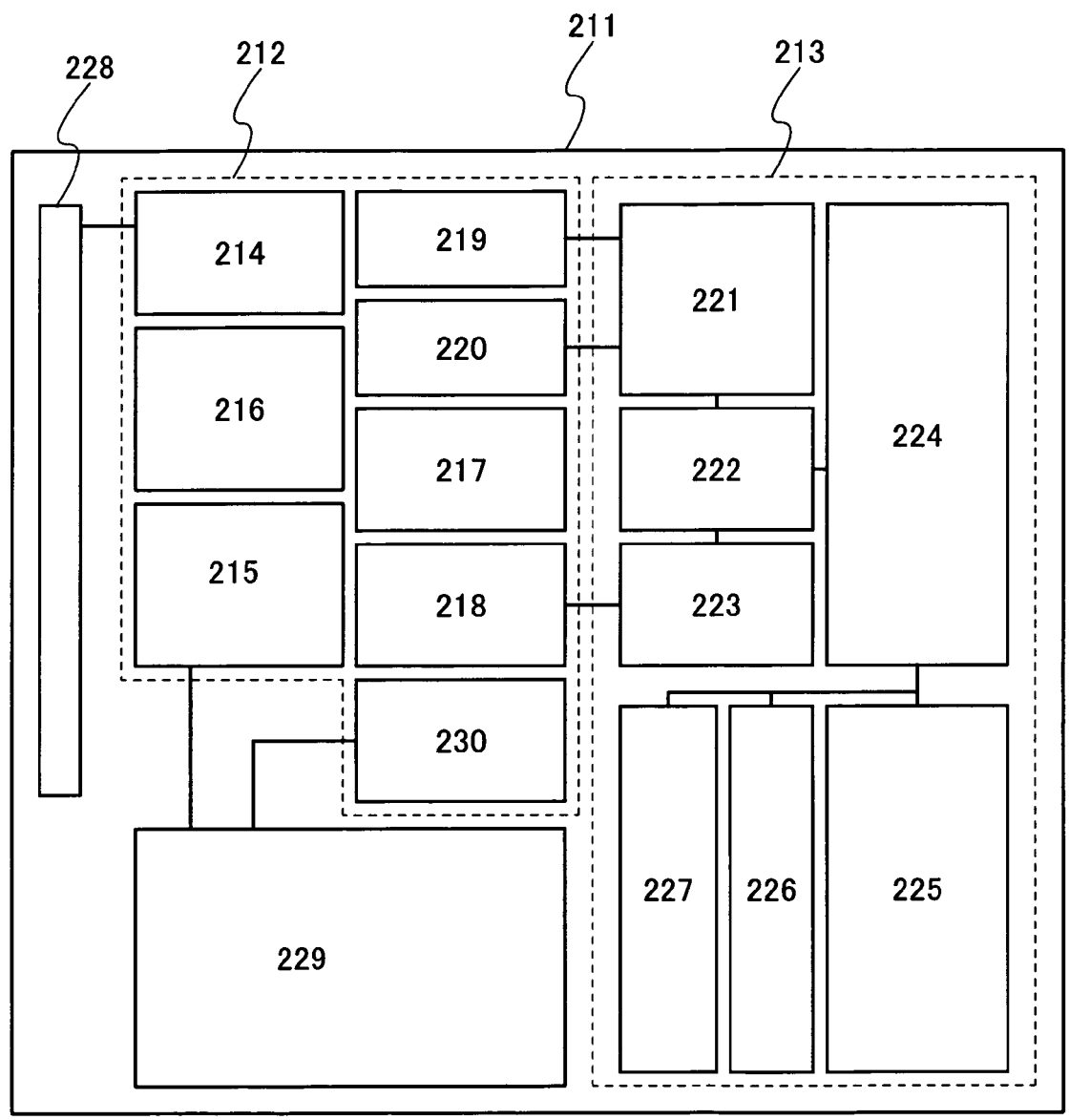
FIG. 12 is a block diagram of a structure of a RFCPU obtained by using a semiconductor substrate in Example of the present invention.

Next, an example of a semiconductor device having an arithmetic function that enables contactless data transmission and reception is described with reference to FIG. 12. FIG. 12 shows an example of a computer that operates to transmit and receive signals to and from an external device by wireless communication (such a computer is hereinafter referred to as an RFCPU). An RFCPU 211 has an analog circuit portion 212 and a digital circuit portion 213. The analog circuit portion 212 has a resonance circuit 214 with a resonance capacitor, a rectifier circuit 215, a constant voltage circuit 216, a reset circuit 217, an oscillator circuit 218, a demodulator circuit 219, a modulator circuit 220, and a power management circuit 230. The digital circuit portion 213 has an RF interface 221, a control register 222, a clock controller 223, a CPU interface 224, a central processing unit 225, a random-access memory 226, and a read-only memory 227.

The operation of the RFCPU 211 having such a configuration is as follows. The resonance circuit 214 generates an induced electromotive force based on a signal received by an antenna 228. The induced electromotive force is stored in a capacitor portion 229 through the rectifier circuit 215. This capacitor portion 229 is preferably formed using a capacitor such as a ceramic capacitor or an electric double layer capacitor. The capacitor portion 229 does not need to be integrated with the RFCPU 211 and it is acceptable as long as the capacitor portion 229 is mounted as a different component on a substrate having an insulating surface which is included in the RFCPU 211.

The reset circuit 217 generates a signal for resetting and initializing the digital circuit portion 213. For example, the reset circuit 217 generates a signal which rises with delay after rise in the power supply voltage, as a reset signal. The oscillator circuit 218 changes the frequency and duty ratio of a clock signal in response to a control signal generated by the constant voltage circuit 216. The demodulator circuit 219 formed using a low-pass filter binarizes a variation of the amplitude of, for example, an amplitude-modulated (ASK) reception signal. The modulator circuit 220 varies the amplitude of an amplitude-modulated (ASK) transmission signal and transmits the data. The modulator circuit 220 changes the amplitude of a communication signal by changing a resonance point of the resonance circuit 214. The clock controller 223 generates a control signal for changing the frequency and duty ratio of a clock signal in accordance with the power supply voltage or a consumption current of the central processing unit 225. The power supply voltage is managed by the power management circuit 230.

A signal input from the antenna 228 to the RFCPU 211 is demodulated by the demodulator circuit 219 and then decomposed into a control command, data, and the like by the RF interface 221. The control command is stored in the control register 222. The control command includes reading of data stored in the read-only memory 227, writing of data to the random-access memory 226, an arithmetic instruction to the central processing unit 225, and the like. The central processing unit 225 accesses the read-only memory 227, the random-access memory 226, and the control register 222 via the CPU interface 224. The CPU interface 224 has a function of generating an access signal for any of the read-only memory 227, the random-access memory 226, and the control register 222 based on an address which the central processing unit 225 requests.

As an arithmetic method of the central processing unit 225, a method may be employed in which the read-only memory 227 stores an operating system (OS) and a program is read and executed at the time of starting operation. Alternatively, a method may be employed in which a dedicated arithmetic circuit is provided and arithmetic processing is conducted using hardware. In a method in which both hardware and software are used, part of processing is conducted by a dedicated arithmetic circuit and the other part of the arithmetic processing is conducted by the central processing unit 225 using a program.

The RFCPU 211 as just described can achieve not only an increase in processing speed but also a reduction in power consumption because an integrated circuit is formed using a single crystal semiconductor layer with uniform crystal orientation which is bonded on a substrate having an insulating surface or an insulating substrate. This makes it possible to ensure the operation for a long period of time even when the capacitor portion 229 which supplies power is downsized.

Figure 13:
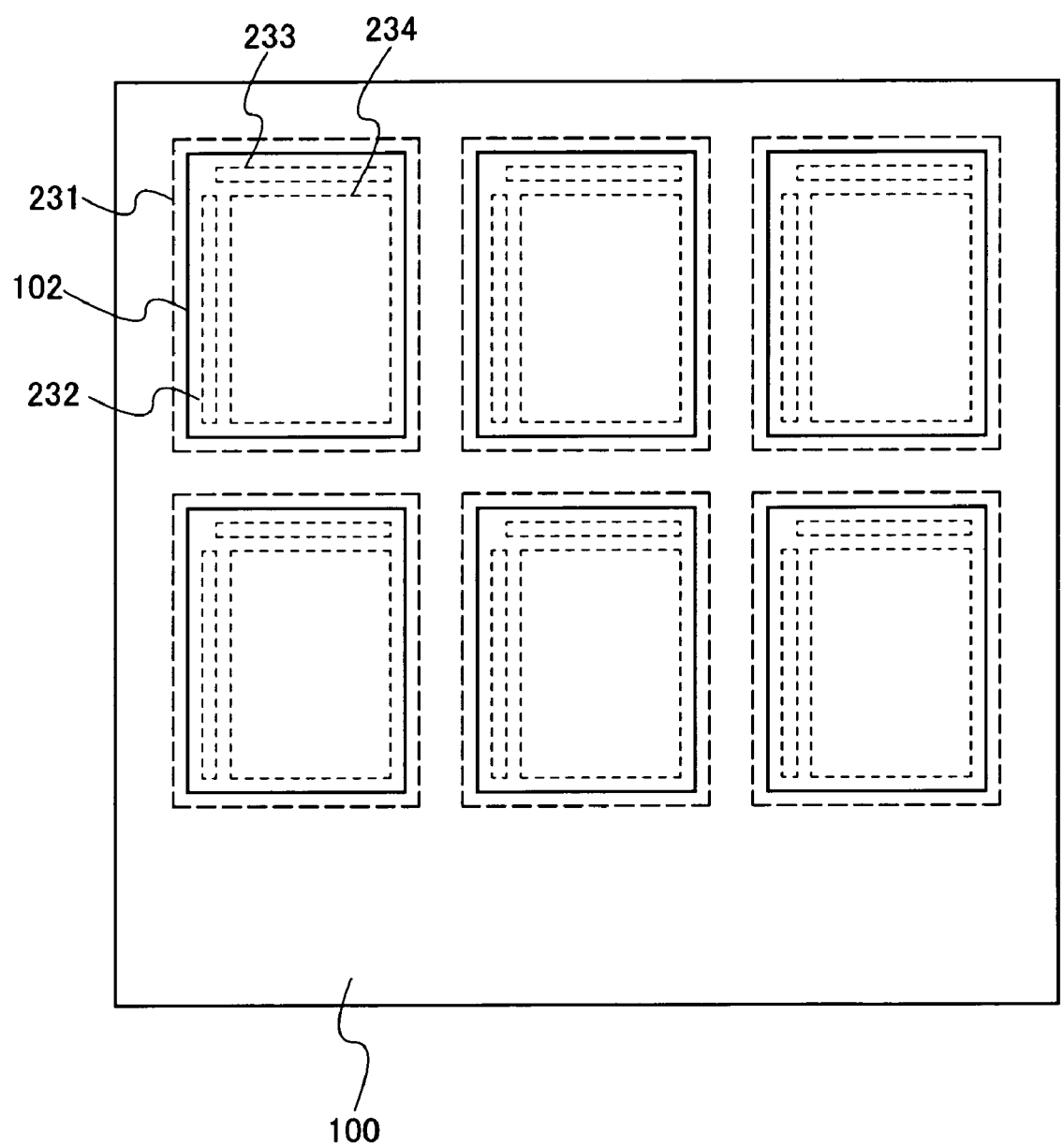
FIG. 13 is a plan view exemplifying a case where an LTSS layer is bonded to a mother glass for manufacturing a display panel in Example of the present invention.

The LTSS layers 102 exemplified in FIGS. 1A and 1B can be bonded to a large glass substrate called mother glass for manufacturing a display panel. FIG. 13 shows the case where the LTSS layers 102 are bonded to a mother glass as the base substrate 100. A plurality of display panels is taken from the mother glass, and the LTSS layers 102 are preferably bonded to correspond to formation regions of display panels 231. Since the mother glass substrate has a larger area than a semiconductor substrate, it is preferable that the LTSS layers 102 are arranged separately as shown in FIG. 13. The display panel 231 includes a scanning line driver circuit region 232, a signal line driver circuit region 233, and a pixel formation region 234. The LTSS layers 102 are bonded to the base substrate 100 (mother glass) so that these regions are included.

Figure 14A:
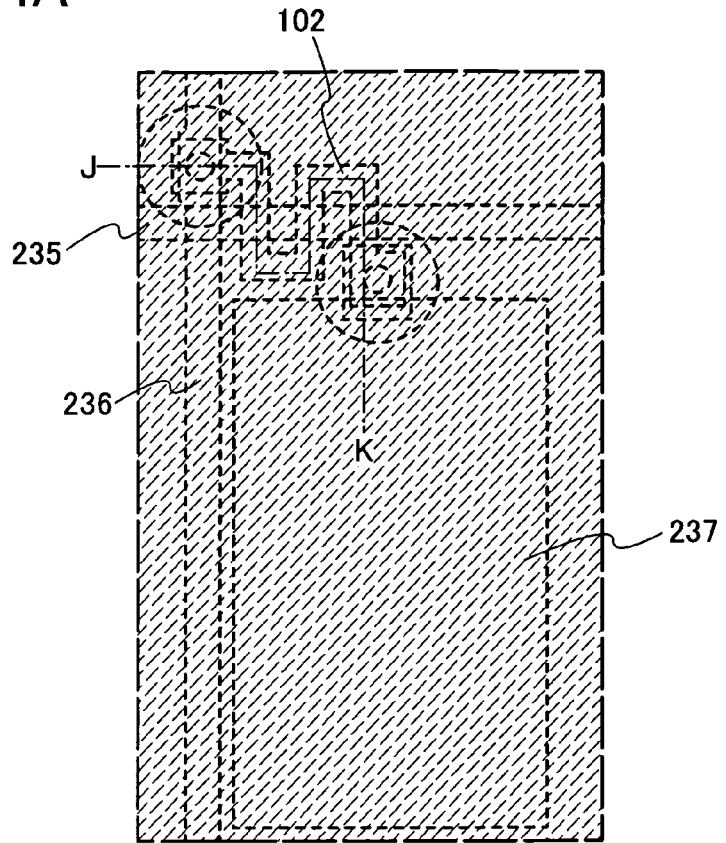
FIGS. 14A and 14B illustrate an example of a display panel including a pixel transistor formed using an LTSS layer in Example of the present invention.
Figure 14B:
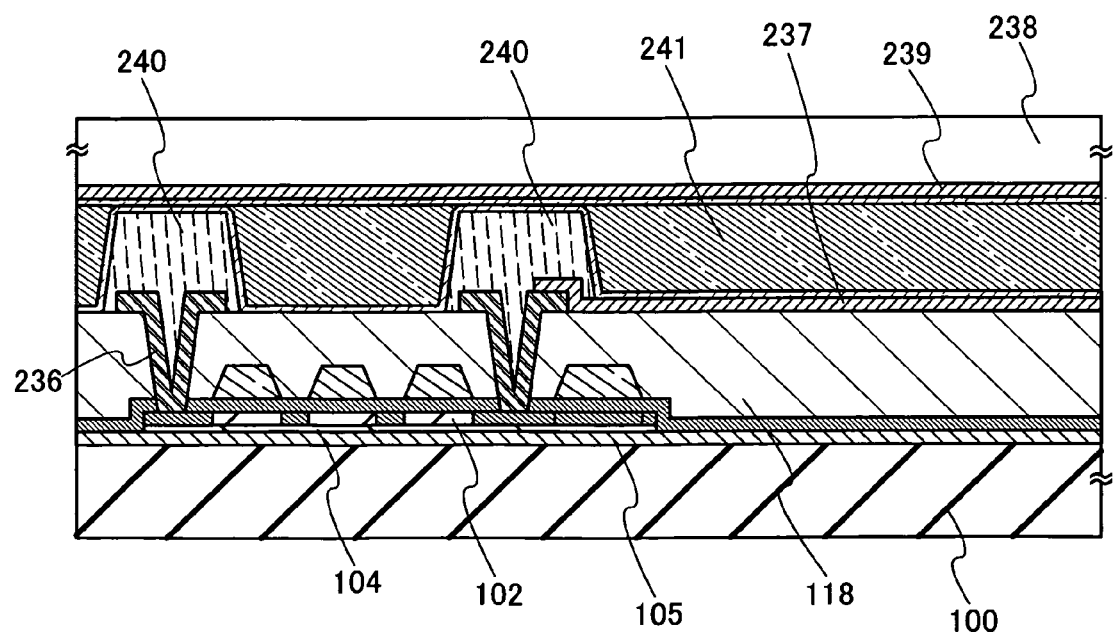

FIGS. 14A and 14B show an example of a pixel of a display panel in which a pixel transistor is formed using the LTSS layer 102. FIG. 14A is a plan view of a pixel, in which a gate wiring 235 intersects with the LTSS layer 102 and the LTSS layer 102 is electrically connected to a source wiring 236 and a pixel electrode 237. FIG. 14B is a cross-sectional view corresponding to the line J-K in FIG. 14A.

In FIG. 14B, a stack of a silicon nitride layer and a silicon oxide layer is formed as the barrier layer 105 over the base substrate 100. The LTSS layer 102 is fixed to the barrier layer 105 with the use of the bonding layer 104. The pixel electrode 237 is provided over an insulating layer 118. By etching of the insulating layer 118, a step in the form of a depression is generated in a contact hole, in which the LTSS layer 102 and the source wiring 236 are connected to each other, and thus, a columnar spacer 240 is provided so as to fill the step. A counter substrate 238 is provided with a counter electrode 239. A liquid layer 241 is formed in a space formed by the columnar spacer 240.

As described above, an LTSS layer can be formed and a transistor can be formed using the LTSS layer also over a mother glass for manufacturing a display panel. The transistor formed using the LTSS layer is superior to an amorphous silicon transistor in all operating characteristics such as performance of current drive; therefore, the transistor can be downsized. Accordingly, an aperture ratio of a pixel portion in the display panel can be improved. Further, since a microprocessor like the one illustrated in FIGS. 11 and 12 can be formed, a function as a computer can be provided in a display panel. Furthermore, a display in which data can be input and output without contact can be manufactured.

This application is based on Japanese Patent Application Serial No. 2007-132590 filed with Japan Patent Office on May 18, 2007, the entire contents of which are hereby incorporated by reference.

What is claimed is:

1. A manufacturing method of a semiconductor substrate; comprising the steps of:
    irradiating one surface of a first single crystal semiconductor substrate with ions to form a first embrittlement layer at a predetermined depth from the one surface of the first single crystal semiconductor substrate;
    forming a plurality of first element formation patterns and a first dummy pattern arranged between the plurality of first element formation patterns in the one surface of the first single crystal semiconductor substrate by etching, wherein the plurality of the first element formation patterns and the first dummy pattern are arranged at a predetermined interval;
    providing a substrate having an insulating surface in order to superpose the first single crystal semiconductor substrate such that the surface of the first single crystal semiconductor substrate, on which the first element formation patterns and the first dummy pattern are formed, is bonded to the insulating surface; and
    separating the first single crystal semiconductor substrate from the plurality of first element formation patterns and the first dummy pattern by thermal treatment, so that the plurality of first element formation patterns and the first dummy pattern are left on the substrate having the insulating surface, wherein the thermal treatment is performed in a state that the first single crystal semiconductor substrate and the substrate having the insulating surface are bonded.

2. The manufacturing method of a semiconductor substrate according to claim 1; further comprising the steps of:
    forming a first silicon oxide film on the one surface of the first single crystal semiconductor substrate by a chemical vapor deposition method using a silane-based gas before forming the plurality of first element formation patterns and the first dummy pattern,
    wherein the first element formation patterns and the first dummy pattern are bonded to the insulating surface with the first silicon oxide film interposed therebetween.

3. The manufacturing method of a semiconductor substrate according to claim 1, wherein the first element formation patterns and the first dummy pattern are formed by etching the first single crystal semiconductor substrate in regions other than the first element formation patterns and the first dummy pattern, deeper than the first embrittlement layer.

4. The manufacturing method of a semiconductor substrate according to claim 1, wherein the first single crystal semiconductor substrate is etched such that at least a cross-sectional view of each of the first element formation patterns is an inversely tapered shape, and a cross-sectional view of each of the first element formation patterns left on the substrate having the insulating surface is a tapered shape.

5. The manufacturing method of a semiconductor substrate according to claim 1, further comprising a step of removing the first dummy pattern left on the substrate having the insulating surface.

6. A manufacturing method of a thin film transistor having a channel region, a source region, and a drain region using the first element formation pattern of the semiconductor substrate formed by the manufacturing method of the semiconductor substrate according to claim 1.

7. The manufacturing method of a semiconductor substrate according to claim 1, further comprising the steps of:
    irradiating one surface of a second single crystal semiconductor substrate with ions to form a second embrittlement layer at a predetermined depth from the surface of the second single crystal semiconductor substrate;
    forming a plurality of second element formation patterns and a second dummy pattern arranged between the plurality of second element formation patterns in the one surface of the second single crystal semiconductor substrate by etching, wherein the plurality of the second element formation patterns and the second dummy pattern are arranged at a predetermined interval;
    providing the substrate having the insulating surface on which at least the first element formation patterns are left in order to superpose the second single crystal semiconductor substrate such that the surface of the second single crystal semiconductor substrate, on which the second element formation patterns and the second dummy pattern are formed, is bonded to the insulating surface, wherein said bonding is conducted so as not to overlap the first element formation patterns or the first dummy pattern with the second element formation patterns or the second dummy pattern; and
    separating the second single crystal semiconductor substrate from the plurality of second element formation patterns and the second dummy pattern; that are left on the substrate having the insulating surface, wherein the thermal treatment is performed in a state that the second single crystal semiconductor substrate and the substrate having the insulating surface are bonded.

8. The manufacturing method of a semiconductor substrate according to claim 7, further comprising the steps of:
    forming a second silicon oxide film on the one surface of the second single crystal semiconductor substrate by a chemical vapor deposition method using a silane-based gas before forming the plurality of second element formation patterns and the second dummy pattern,
    wherein the second element formation patterns and the second dummy pattern are bonded to the insulating surface with the second silicon oxide film interposed therebetween.

9. The manufacturing method of a semiconductor substrate according to claim 7, wherein the second element formation patterns and the second dummy pattern are formed by etching the second single crystal semiconductor substrate in regions other than the second element formation patterns and the second dummy pattern, deeper than the second embrittlement layer.

10. The manufacturing method of a semiconductor substrate according to claim 7, wherein the second single crystal semiconductor substrate is etched such that at least a cross-sectional view of each of the second element formation patterns is an inversely tapered shape, and a cross-sectional view of each of the second element formation patterns left on the substrate having the insulating surface is a tapered shape.

11. The manufacturing method of a semiconductor substrate according to claim 7, wherein the thicknesses of the second element formation patterns and the second dummy pattern are larger than those of the first element formation patterns and the first dummy pattern.

12. The manufacturing method of a semiconductor substrate according to claim 7, further comprising a step of removing the second dummy pattern left on the substrate having the insulating surface.

13. The manufacturing method of a semiconductor substrate according to claim 7, wherein a crystal face of a surface of the first single crystal semiconductor substrate is different from a crystal face of a surface of the second single crystal semiconductor substrate.

14. The manufacturing method of a semiconductor substrate according to claim 13, wherein one of the different crystal faces is {100} and the other is {110}.

15. A manufacturing method of a semiconductor device according to claim 14 further comprising:
forming an n-channel thin film transistor using the first element formation pattern formed from the first single crystal semiconductor substrate having the crystal face {100}, and forming a p-channel thin film transistor using the second element formation pattern formed from the second single crystal semiconductor substrate having the crystal face {110}.

16. A manufacturing method of a semiconductor device according to claim 14 further comprising:
forming a p-channel thin film transistor using the first element formation pattern formed from the first single crystal semiconductor substrate having the crystal face {110}, and forming an n-channel thin film transistor using the second element formation pattern formed from the second single crystal semiconductor substrate having the crystal face {100}.

17. A manufacturing method of a semiconductor substrate, comprising the steps of:
irradiating one surface of a first single crystal semiconductor substrate with ions to form a first embrittlement layer at a predetermined depth from the surface of the first single crystal semiconductor substrate;
providing a substrate having an insulating surface in order to superpose the first single crystal semiconductor substrate such that the one surface of the first single crystal semiconductor substrate is bonded to the insulating surface;
separating the first single crystal semiconductor substrate from a single crystal semiconductor layer by thermal treatment, so that the single crystal semiconductor layer is left on the substrate having the insulating surface, wherein the thermal treatment is performed in a state that the first single crystal semiconductor substrate and the substrate having the insulating surface are bonded;
etching the single crystal semiconductor layer to form a plurality of first element formation patterns;
irradiating one surface of a second single crystal semiconductor substrate with ions to form a second embrittlement layer at a predetermined depth from the surface of the second single crystal semiconductor substrate;
forming a plurality of second element formation patterns and a dummy pattern arranged between the plurality of second element formation patterns in the one surface of the second single crystal semiconductor substrate by etching, wherein the plurality of second element formation patterns and the dummy pattern are arranged at a predetermined interval;
providing the substrate having the insulating surface on which the first element formation patterns are left in order to superpose the second single crystal semiconductor substrate such that the surface of the second single crystal semiconductor substrate, on which the second element formation patterns and the dummy pattern are formed, is bonded to the insulating surface, wherein said bonding is conducted so as not to overlap the first element formation patterns with the second element formation patterns or the dummy pattern; and
separating the second single crystal semiconductor substrate from the plurality of second element formation patterns and the dummy pattern; that are left on the substrate having the insulating surface, wherein the thermal treatment is performed in a state that the second single crystal semiconductor substrate and the substrate having the insulating surface are bonded.

18. A manufacturing method of a semiconductor substrate, comprising the steps of:
irradiating one surface of a first single crystal semiconductor substrate with ions to form a first embrittlement layer at a predetermined depth from the surface of the first single crystal semiconductor substrate;
providing a substrate having an insulating surface in order to superpose the first single crystal semiconductor substrate such that the one surface of the first single crystal semiconductor substrate is bonded to the insulating surface;
separating the first single crystal semiconductor substrate from a single crystal semiconductor layer by thermal treatment, so that the single crystal semiconductor layer is left on the substrate having the insulating surface, wherein the thermal treatment is performed in a state that the first single crystal semiconductor substrate and the substrate having the insulating surface are bonded;
etching the single crystal semiconductor layer to form a plurality of first element formation patterns and a dummy pattern formed between the plurality of first element formation patterns, wherein the plurality of the first element formation patterns and the dummy patterns are arranged at a predetermined interval;
irradiating one surface of a second single crystal semiconductor substrate with ions to form a second embrittlement layer at a predetermined depth from the surface of the second single crystal semiconductor substrate;
forming a plurality of second element formation patterns in the one surface of the second single crystal semiconductor substrate by etching;
providing the substrate having the insulating surface on which the first element formation patterns and the dummy pattern are left in order to superpose the second single crystal semiconductor substrate such that the surface of the second single crystal semiconductor substrate, on which the second element formation patterns are formed, is bonded to the insulating surface, wherein said bonding is conducted so as not to overlap the first element formation patterns or the dummy pattern with the second element formation patterns; and
separating the second single crystal semiconductor substrate from the plurality of second element formation patterns; that are left on the substrate having the insulating surface, wherein the thermal treatment is performed in a state that the second single crystal semiconductor substrate and the substrate having the insulating surface are bonded.

19. The manufacturing method of a semiconductor substrate according to claim 17; further comprising the steps of:
forming a first silicon oxide film on the one surface of the first single crystal semiconductor substrate by a chemical vapor deposition method using a silane-based gas before the first single crystal semiconductor substrate is bonded to the insulating surface; and forming a second silicon oxide film on the one surface of the second single crystal semiconductor substrate by a chemical vapor deposition method using a silane-based gas before forming the plurality of second element formation patterns and the dummy pattern, wherein the first element formation patterns are bonded to the insulating surface with the first silicon oxide film interposed therebetween, and wherein the second element formation patterns and the dummy pattern are bonded to the insulating surface with the second silicon oxide film interposed therebetween.

20. The manufacturing method of a semiconductor substrate according to claim 18; further comprising the steps of:

forming a first silicon oxide film on the one surface of the first single crystal semiconductor substrate by a chemical vapor deposition method using a silane-based gas before the first single crystal semiconductor substrate is bonded to the insulating surface; and forming a second silicon oxide film on the one surface of the second single crystal semiconductor substrate by a chemical vapor deposition method using a silane-based gas before forming the plurality of second element formation patterns, wherein the first element formation patterns and the dummy pattern are bonded to the insulating surface with the first silicon oxide film interposed therebetween, and wherein the second element formation patterns are bonded to the insulating surface with the second silicon oxide film interposed therebetween.

21. The manufacturing method of a semiconductor substrate according to claim 17, wherein the second element formation patterns and the dummy pattern are formed by etching the second single crystal semiconductor substrate in regions other than the second element formation patterns and the dummy pattern, deeper than the second embrittlement layer.

22. The manufacturing method of a semiconductor substrate according to claim 18, wherein the second element formation patterns are formed by etching the second single crystal semiconductor substrate in regions other than the second element formation patterns, deeper than the second embrittlement layer.

23. The manufacturing method of a semiconductor substrate according to claim 17, wherein the thicknesses of the second element formation patterns and the dummy pattern are larger than those of the first element formation patterns.

24. The manufacturing method of a semiconductor substrate according to claim 17, further comprising a step of removing the dummy pattern left on the substrate having the insulating surface.

25. The manufacturing method of a semiconductor substrate according to claim 18, further comprising a step of removing the dummy pattern left on the substrate having the insulating surface.

26. The manufacturing method of a semiconductor substrate according to claim 17, wherein the second single crystal semiconductor substrate is etched such that at least a cross-sectional view of each of the second element formation patterns is an inversely tapered shape, and a cross-sectional view of each of the second element formation patterns left on the substrate having the insulating surface is a tapered shape.

27. The manufacturing method of a semiconductor substrate according to claim 18, wherein the second single crystal semiconductor substrate is etched such that at least a cross-sectional view of each of the second element formation patterns is an inversely tapered shape, and a cross-sectional view of each of the second element formation patterns left on the substrate having the insulating surface is a tapered shape.

28. The manufacturing method of a semiconductor substrate according to claim 17, wherein a crystal face of a surface of the first single crystal semiconductor substrate is different from a crystal face of a surface of the second single crystal semiconductor substrate.

29. The manufacturing method of a semiconductor substrate according to claim 18, wherein a crystal face of a surface of the first single crystal semiconductor substrate is different from a crystal face of a surface of the second single crystal semiconductor substrate.

30. The manufacturing method of a semiconductor substrate according to claim 28, wherein one of the different crystal faces is $\{100\}$ and the other is $\{110\}$.

31. The manufacturing method of a semiconductor substrate according to claim 29, wherein one of the different crystal faces is $\{100\}$ and the other is $\{110\}$.

32. A manufacturing method of a semiconductor device according to claim 30 further comprising:

forming an n-channel thin film transistor using the first element formation pattern formed from the first single crystal semiconductor substrate having the crystal face $\{100\}$, and forming a p-channel thin film transistor using the second element formation pattern formed from the second single crystal semiconductor substrate having the crystal face $\{110\}$.

33. A manufacturing method of a semiconductor device according to claim 30 further comprising:

forming a p-channel thin film transistor using the first element formation pattern formed from the first single crystal semiconductor substrate having the crystal face $\{110\}$, and forming an n-channel thin film transistor using the second element formation pattern formed from the second single crystal semiconductor substrate having the crystal face $\{100\}$.

34. A manufacturing method of a semiconductor device according to claim 31 further comprising:

forming an n-channel thin film transistor using the first element formation pattern formed from the first single crystal semiconductor substrate having the crystal face $\{100\}$, and forming a p-channel thin film transistor using the second element formation pattern formed from the second single crystal semiconductor substrate having the crystal face $\{110\}$.

35. A manufacturing method of a semiconductor device according to claim 31 further comprising:

forming a p-channel thin film transistor using the first element formation pattern formed from the first single crystal semiconductor substrate having the crystal face $\{110\}$, and forming an n-channel thin film transistor using the second element formation pattern formed from the second single crystal semiconductor substrate having the crystal face $\{100\}$.

* * * * *